US011092677B2

(12) United States Patent
Hasegawa

(10) Patent No.: US 11,092,677 B2
(45) Date of Patent: Aug. 17, 2021

(54) TIME MEASUREMENT DEVICE AND TIME MEASUREMENT UNIT

(71) Applicant: Sony Semiconductor Solutions Corporation, Kanagawa (JP)

(72) Inventor: Koichi Hasegawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/477,088

(22) PCT Filed: Sep. 10, 2018

(86) PCT No.: PCT/JP2018/033381
§ 371 (c)(1),
(2) Date: Jul. 10, 2019

(87) PCT Pub. No.: WO2019/065174
PCT Pub. Date: Apr. 4, 2019

(65) Prior Publication Data
US 2019/0353760 A1    Nov. 21, 2019

(30) Foreign Application Priority Data

Sep. 29, 2017   (JP) .............................. JP2017-190304

(51) Int. Cl.
*G01S 7/4865*   (2020.01)
*G01S 7/4863*   (2020.01)
(Continued)

(52) U.S. Cl.
CPC .......... *G01S 7/4865* (2013.01); *G01S 7/4863* (2013.01); *G01S 17/89* (2013.01); *H01L 31/107* (2013.01)

(58) Field of Classification Search
CPC ...... G01S 17/89; G01S 7/4863; G01S 7/4865; H01L 31/10; H01L 31/107
See application file for complete search history.

(56) References Cited

U.S. PATENT DOCUMENTS 7,843,029 B2 * 11/2010 Kawahito ............... G01S 17/89
                                                     257/461
8,686,367 B2 *  4/2014 Shah ...................... G01S 17/10
                                                     250/341.8
(Continued)

FOREIGN PATENT DOCUMENTS

JP    2008-141551 A    6/2008
JP    2014-077658 A    5/2014
(Continued)

OTHER PUBLICATIONS

Extended European Search Report dated Feb. 4, 2020 for related Application No. 18860216.3.
(Continued)

*Primary Examiner* — Yuqing Xiao
*Assistant Examiner* — Amir J Askarian
(74) *Attorney, Agent, or Firm* — Michael Best & Friedrich LLP

(57) ABSTRACT

An object of the present invention is to provide a time measurement device that facilitates a circuit layout.
A time measurement device (20) of the present invention includes: a plurality of pixels (30) provided side by side in a first direction, and each including a single-photon avalanche diode (SPAD) disposed on a first semiconductor substrate, and each generating a first logic signal (S35) depending on detection timing in the single-photon avalanche diode (SPAD); and a time measurement section (24) that is disposed on a second semiconductor substrate attached to the first semiconductor substrate and measures the detection timing in each of the plurality of pixels (30). Pixels, other than a first pixel disposed on an end in the first direction and out of the plurality of pixels (30), each generate output signals on a basis of an output signal of a pixel other than relevant one of the pixels and on a basis of the first logic signals (S35) generated in the relevant one of (Continued)

the pixels, and the time measurement section (24) measures the detection timing in each of the plurality of pixels (30) on a basis of an output signal of a second pixel disposed on another end in the first direction out of the plurality of pixels (30).

The time measurement device (20) of the present invention is applicable to a distance measurement device.

22 Claims, 24 Drawing Sheets

(51) Int. Cl.
*G01S 17/89* (2020.01)
*H01L 31/107* (2006.01)

(56) References Cited

U.S. PATENT DOCUMENTS

| | | | | |
|---|---|---|---|---|
| 9,829,710 | B1* | 11/2017 | Newell | G02B 27/0176 |
| 2001/0001562 | A1* | 5/2001 | Orava | G01T 1/2928 |
| | | | | 348/302 |
| 2010/0053405 | A1* | 3/2010 | Lehmann | H04N 5/369 |
| | | | | 348/311 |
| 2010/0123694 | A1* | 5/2010 | Cok | G09G 3/3225 |
| | | | | 345/206 |
| 2014/0313387 | A1* | 10/2014 | Vogelsang | H04N 5/35527 |
| | | | | 348/308 |
| 2015/0055000 | A1* | 2/2015 | Bock | H04N 5/35554 |
| | | | | 348/308 |
| 2015/0256774 | A1* | 9/2015 | Nishihara | H01L 27/14612 |
| | | | | 348/216.1 |
| 2016/0010986 | A1 | 1/2016 | Sun et al. | |
| 2016/0054447 | A1* | 2/2016 | Sun | G01S 17/894 |
| | | | | 356/5.01 |
| 2016/0284743 | A1* | 9/2016 | Mellot | H01L 27/1443 |
| 2016/0353042 | A1* | 12/2016 | Wang | H01L 27/14614 |
| 2017/0041564 | A1* | 2/2017 | Konstantatos | H04N 5/376 |
| 2017/0223283 | A1* | 8/2017 | Freestone | H04N 5/3741 |
| 2018/0045513 | A1* | 2/2018 | Kitamura | G01S 17/894 |
| 2018/0259647 | A1* | 9/2018 | Takano | G01C 3/08 |
| 2018/0275255 | A1* | 9/2018 | Yates | G01S 17/89 |
| 2018/0329063 | A1* | 11/2018 | Takemoto | G01S 17/86 |
| 2018/0348369 | A1* | 12/2018 | Ohki | G01S 7/4914 |
| 2020/0158831 | A1* | 5/2020 | Niclass | G01S 17/894 |

FOREIGN PATENT DOCUMENTS

| | | |
|---|---|---|
| JP | 2015-078953 A | 4/2015 |
| WO | 2016/170833 A1 | 10/2016 |
| WO | WO-2018085841 A1 * 5/2018 | ............ G01J 3/28 |

OTHER PUBLICATIONS

Cristiano N. et al., "Design and Characterization of a 256x64-Pixel Single-Photon imager in CMOS for a MEMS-Based Laser Scanning Time-Of-Flight Sensor" Optics Express, vol. 20, No. 11, May 10, 2012 pp. 11863-11881.
International Search Report dated Dec. 4, 2018 for corresponding International Application No. PCT/JP2018/033381.
International Searching Authority Written Opinion dated Dec. 4, 2018 for corresponding International Application No. PCT/JP2018/033381.
International Preliminary Report on Patentability dated Mar. 31, 2020 for corresponding International Application No. PCT/JP2018/033381,

* cited by examiner

[Fig 1]
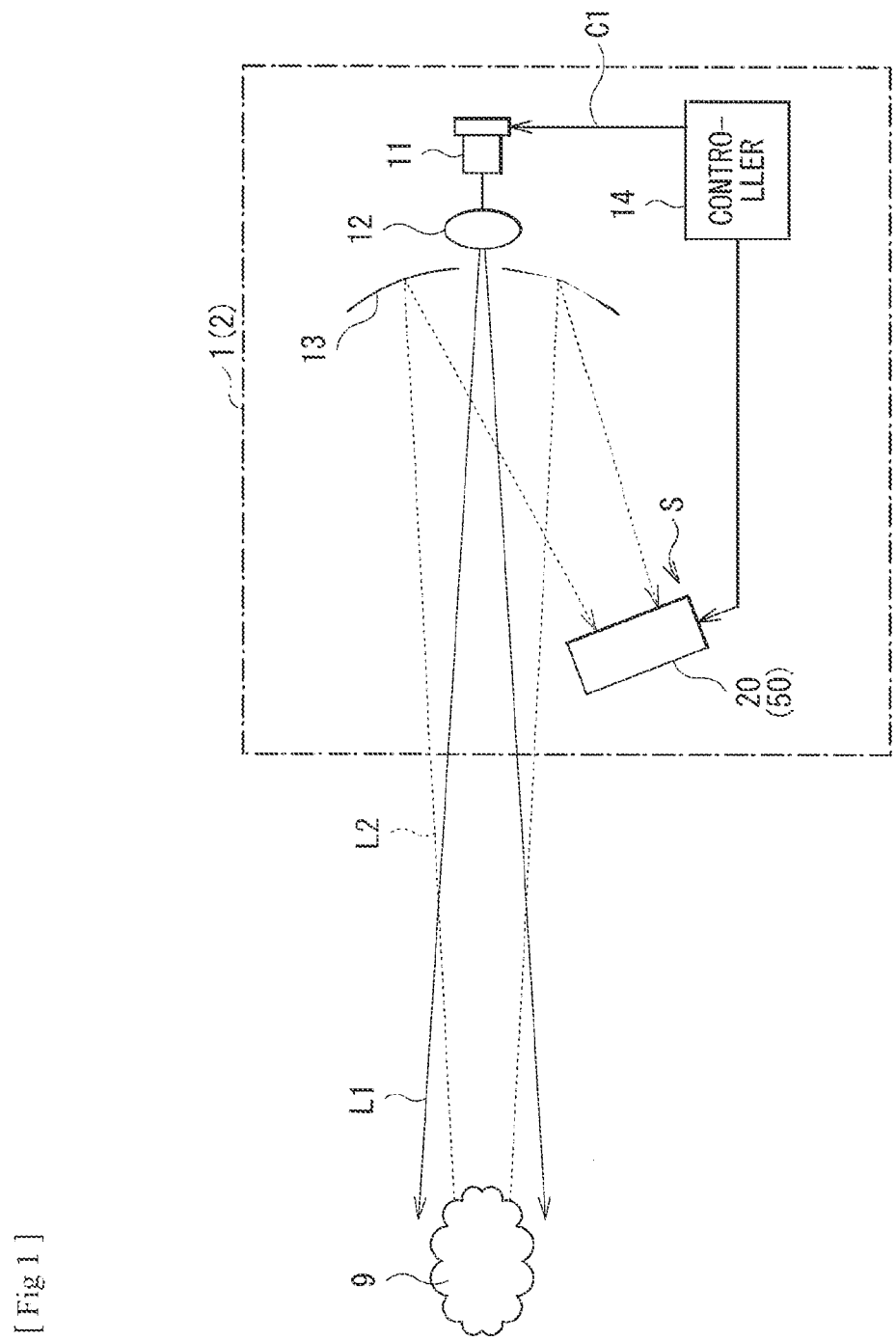

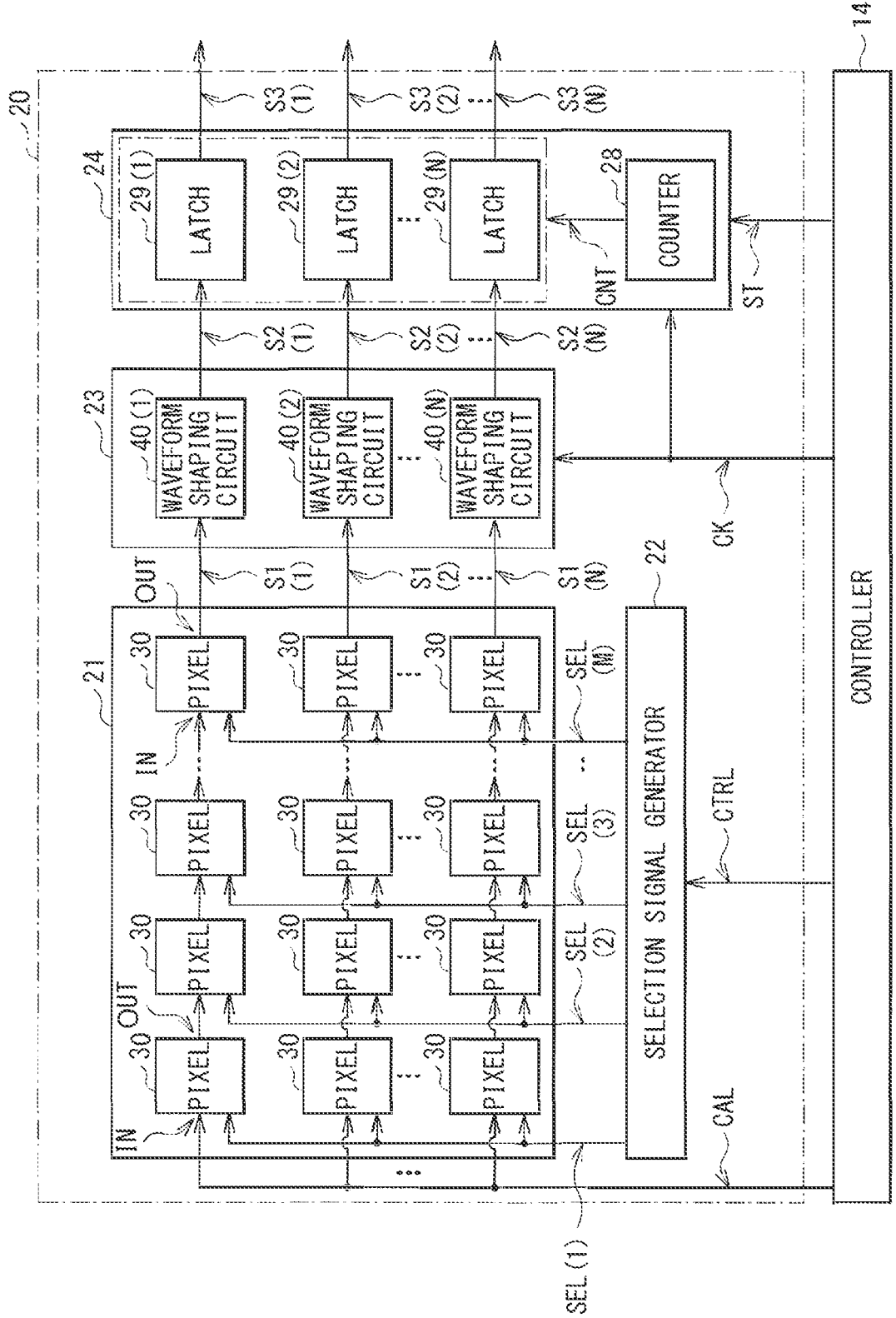
[Fig 2]

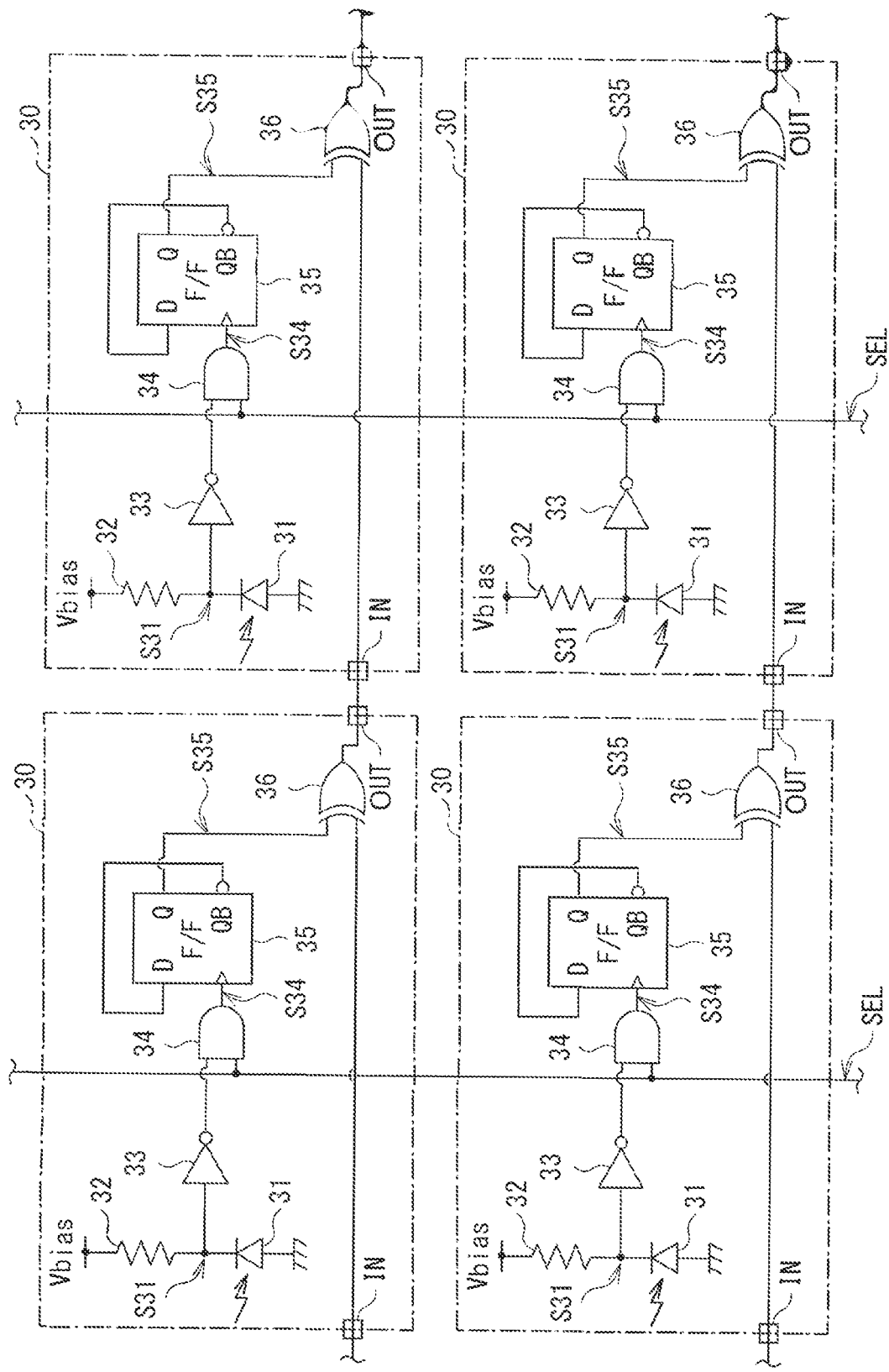
[Fig 3]

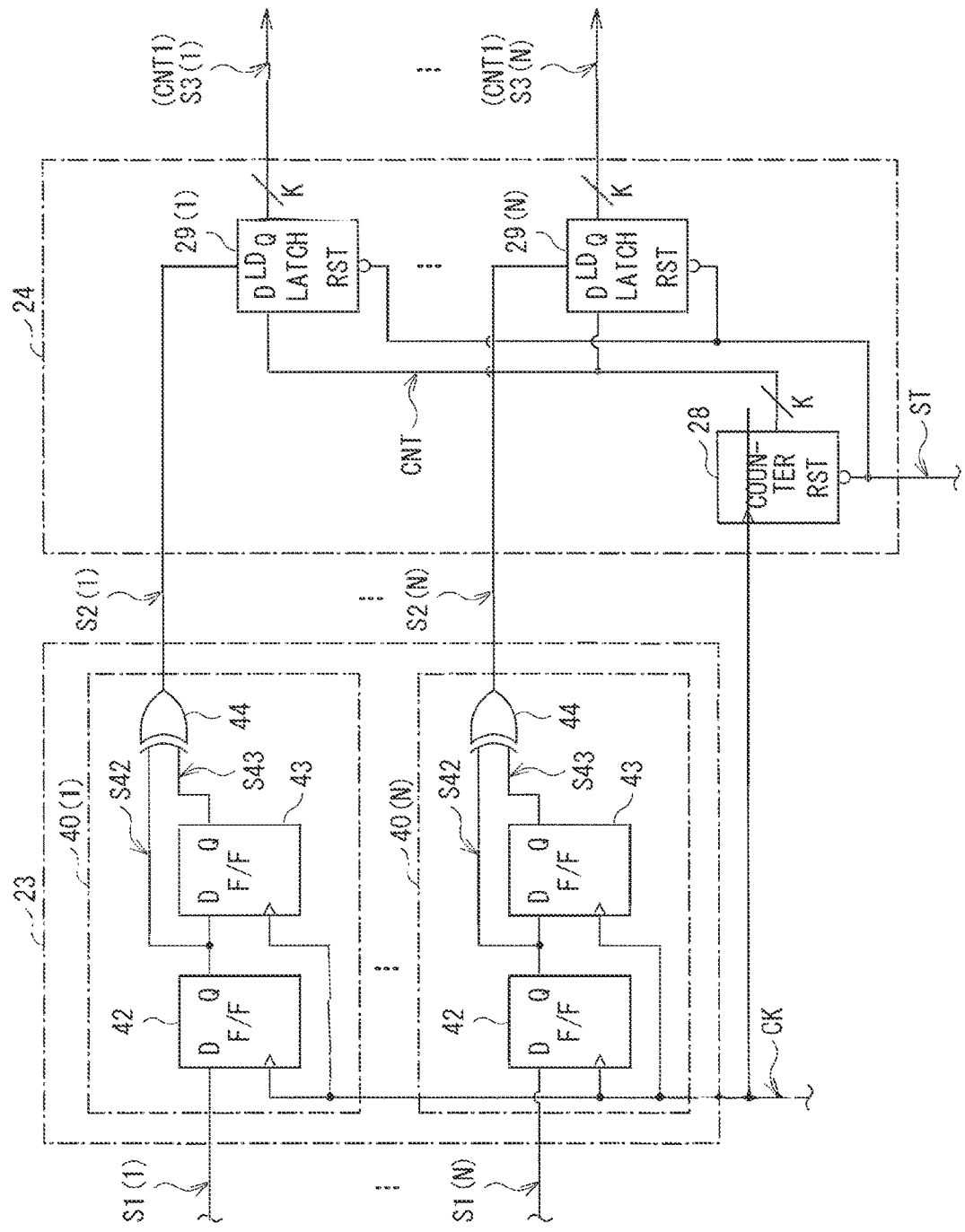

[ FIG. 5 ]
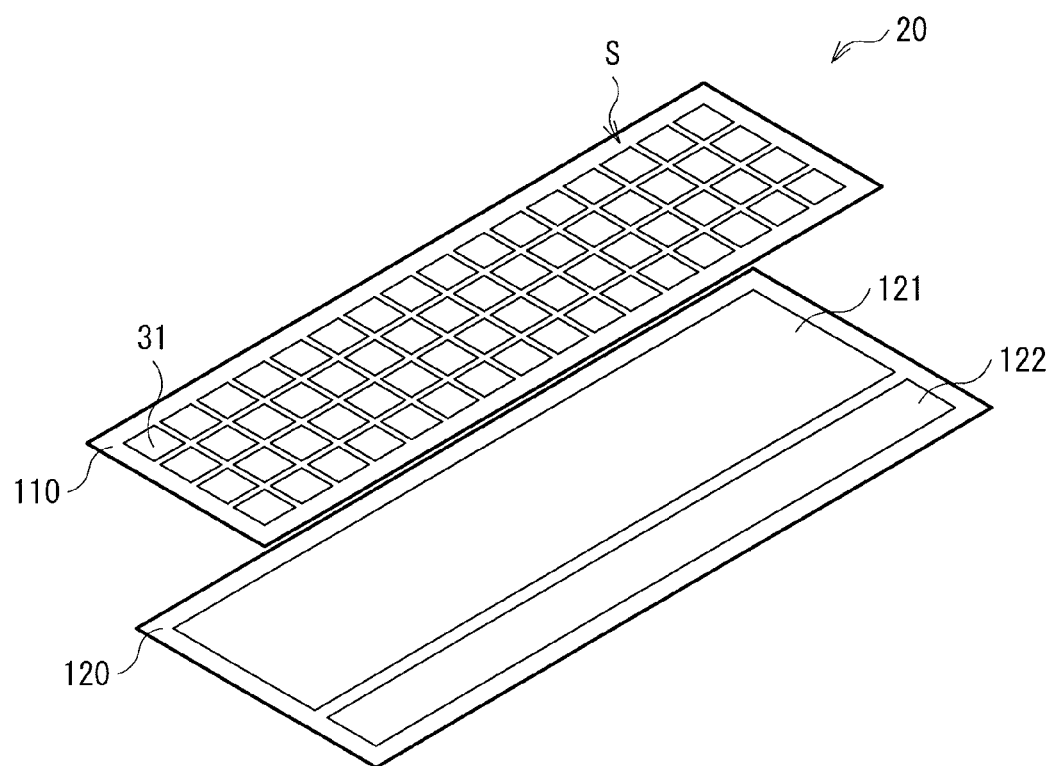

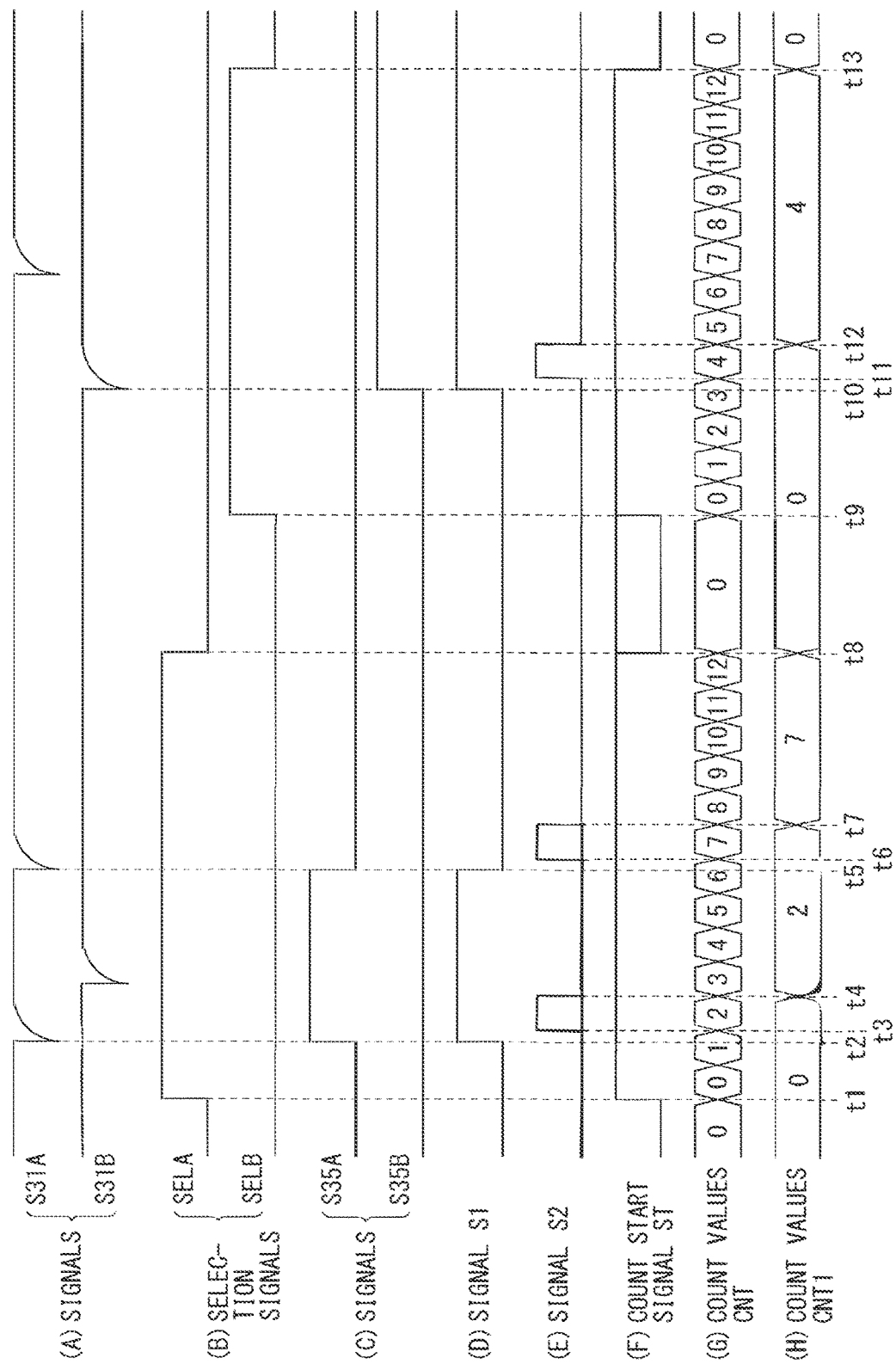

[ FIG. 7 ]
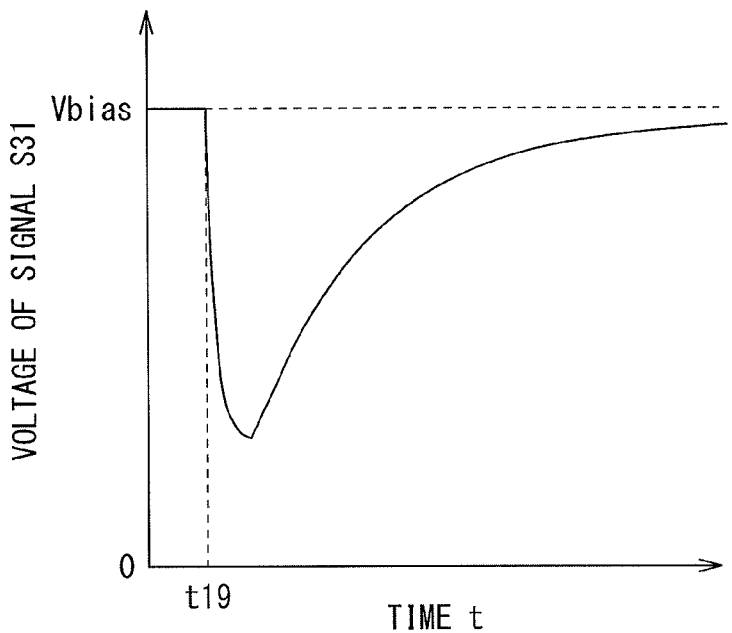
[ FIG. 8 ]
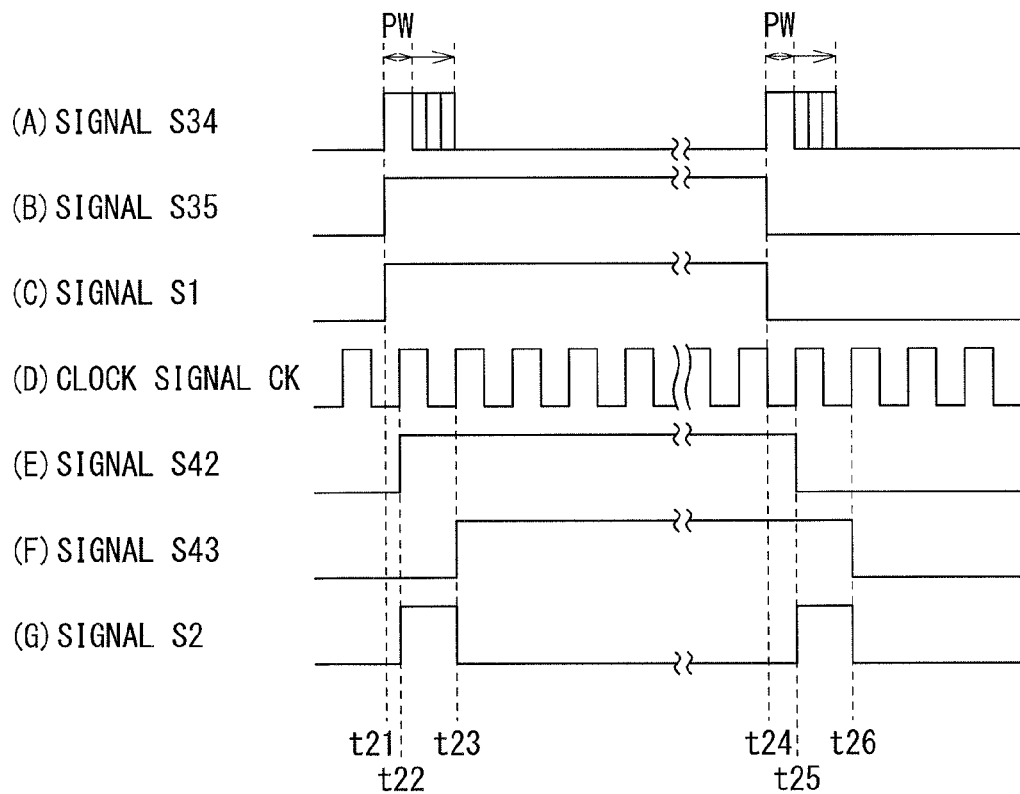

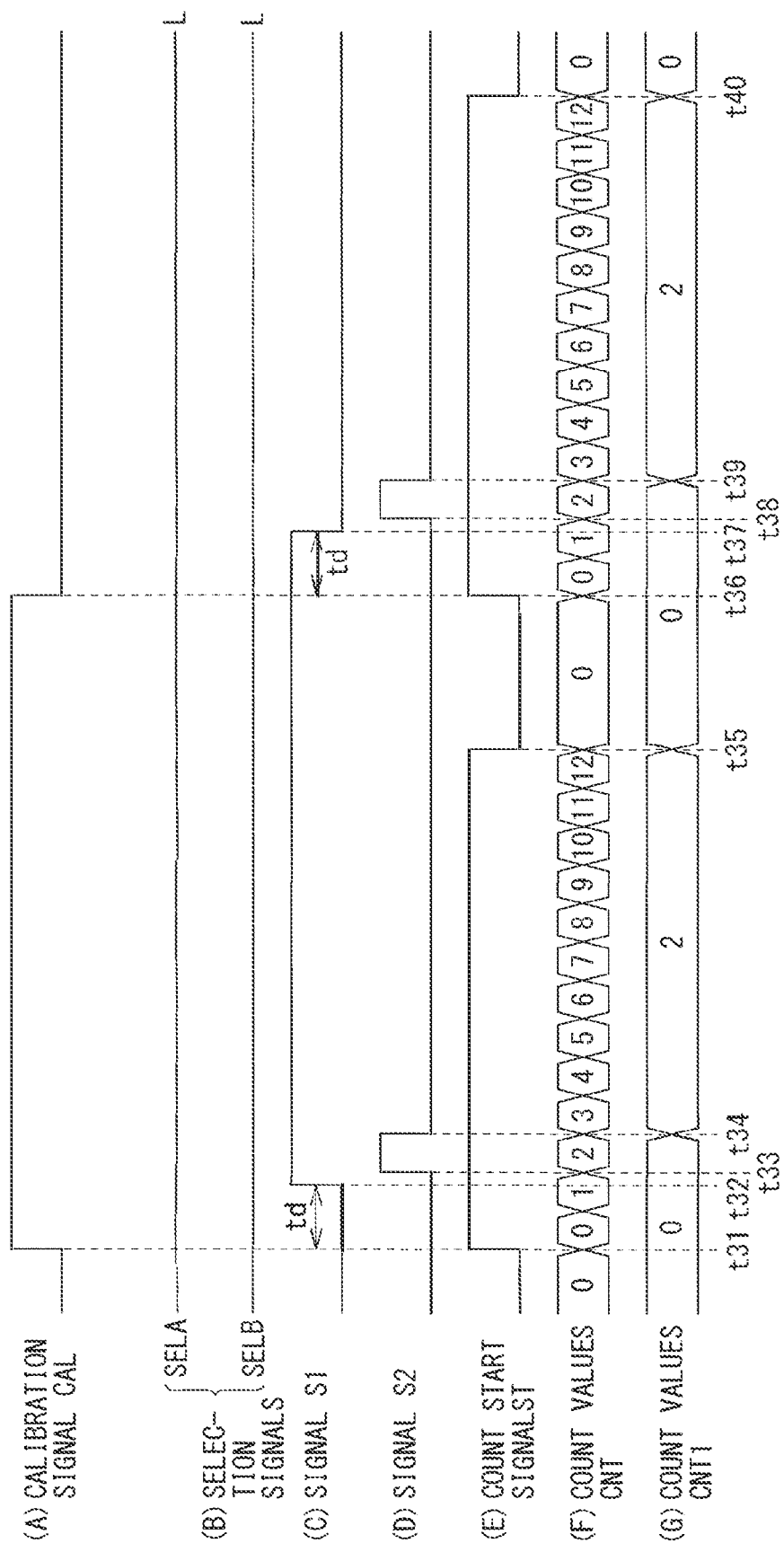

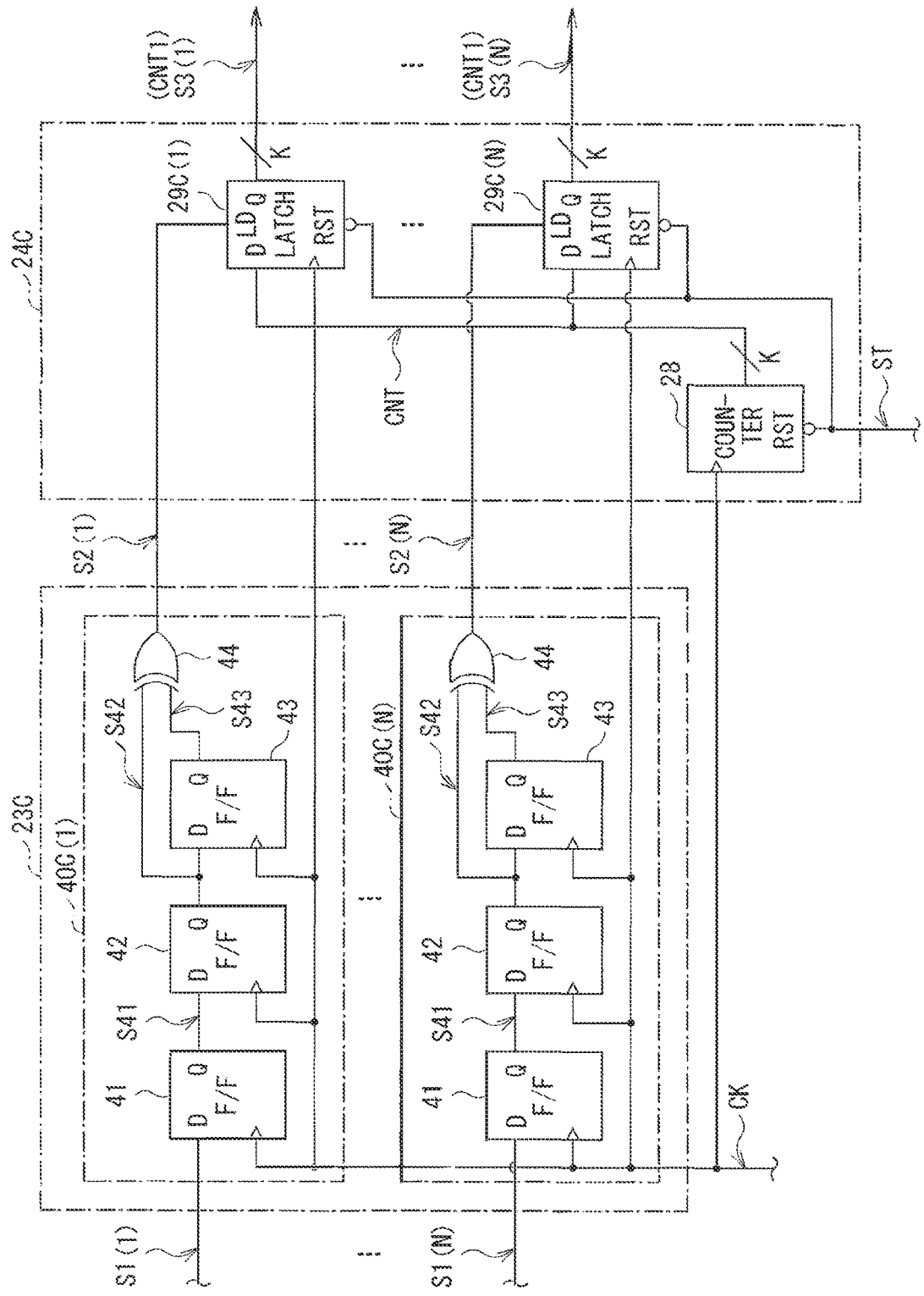
[Fig 10]

[Fig 11]
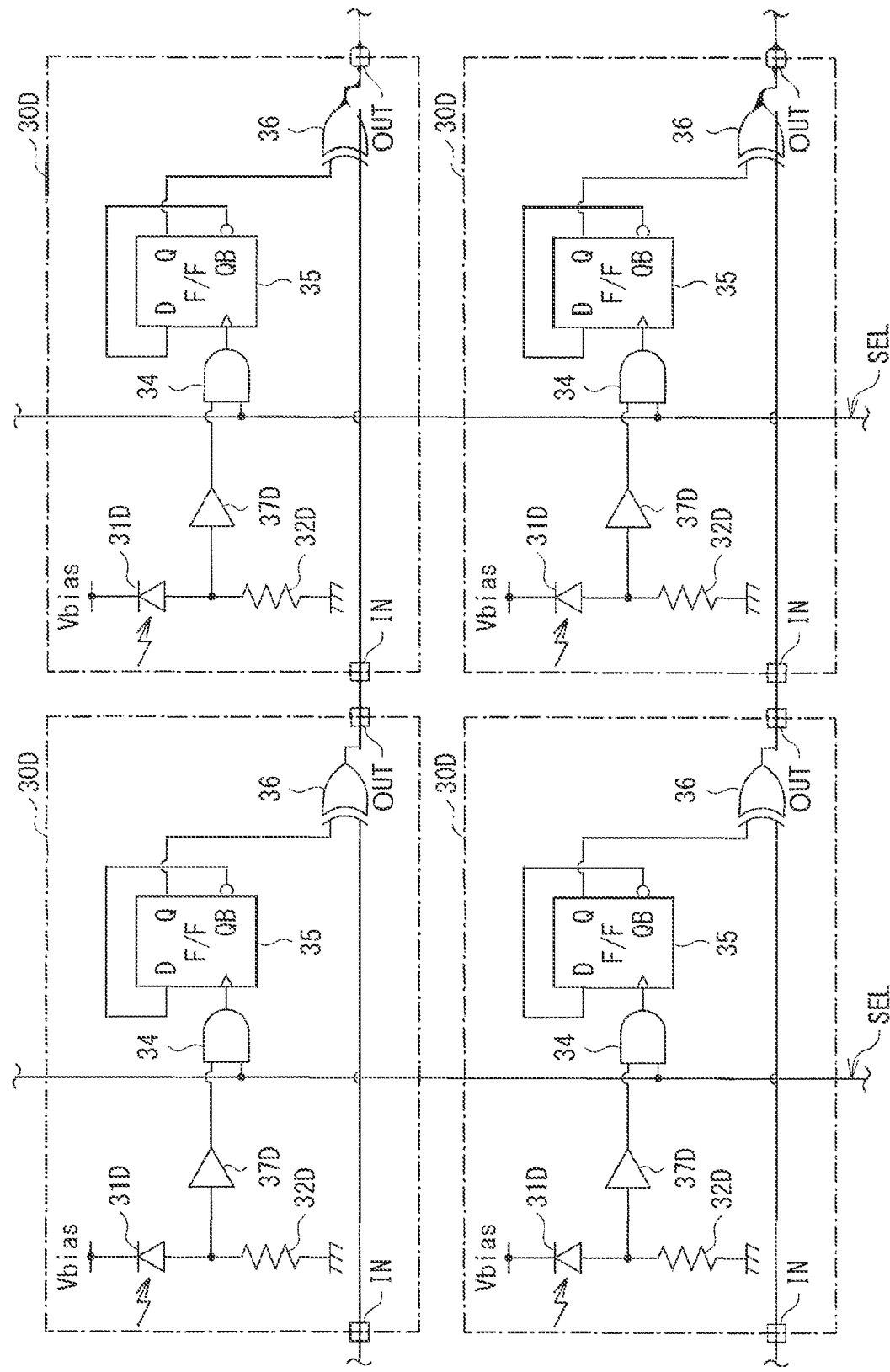

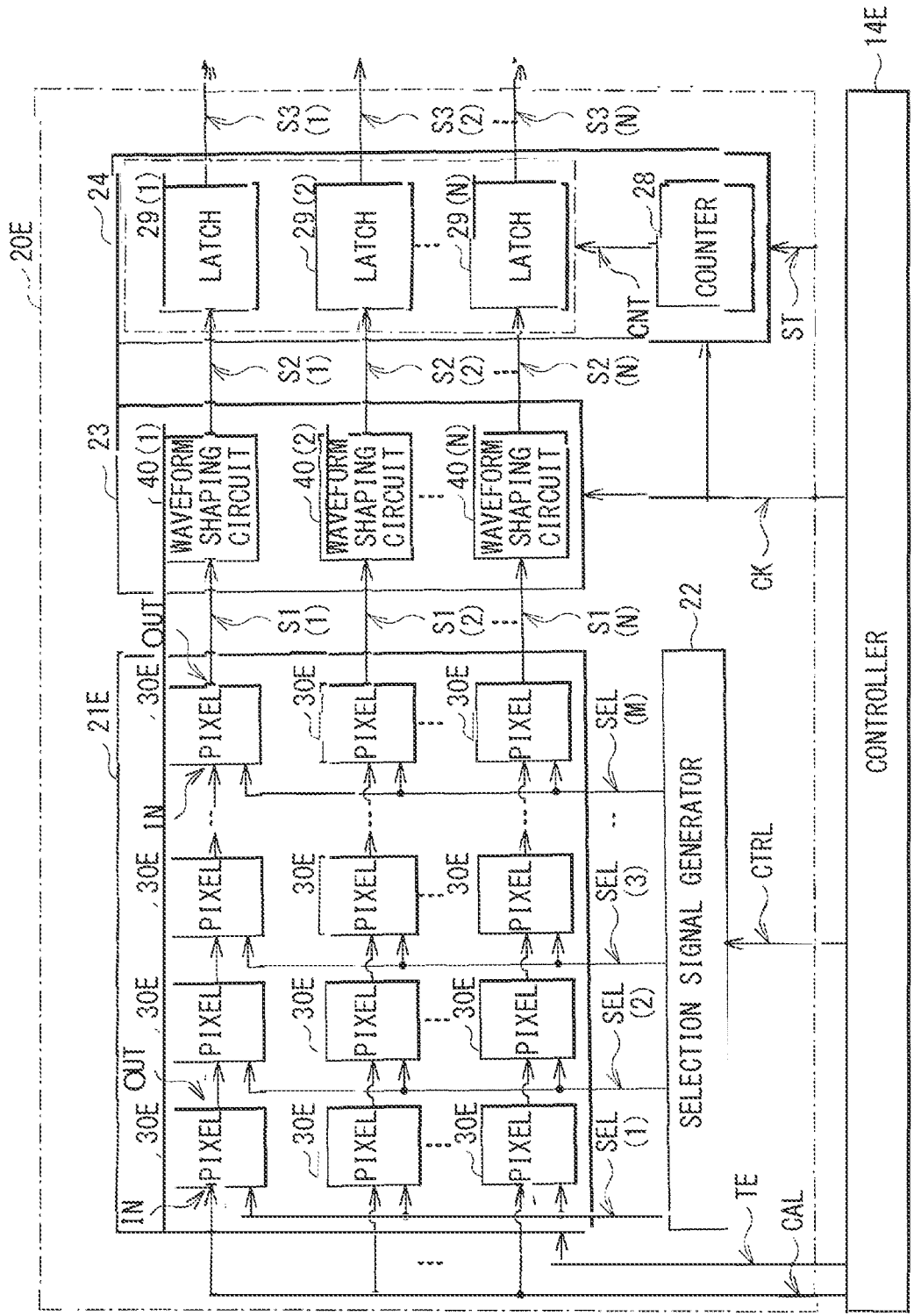
[Fig 12]

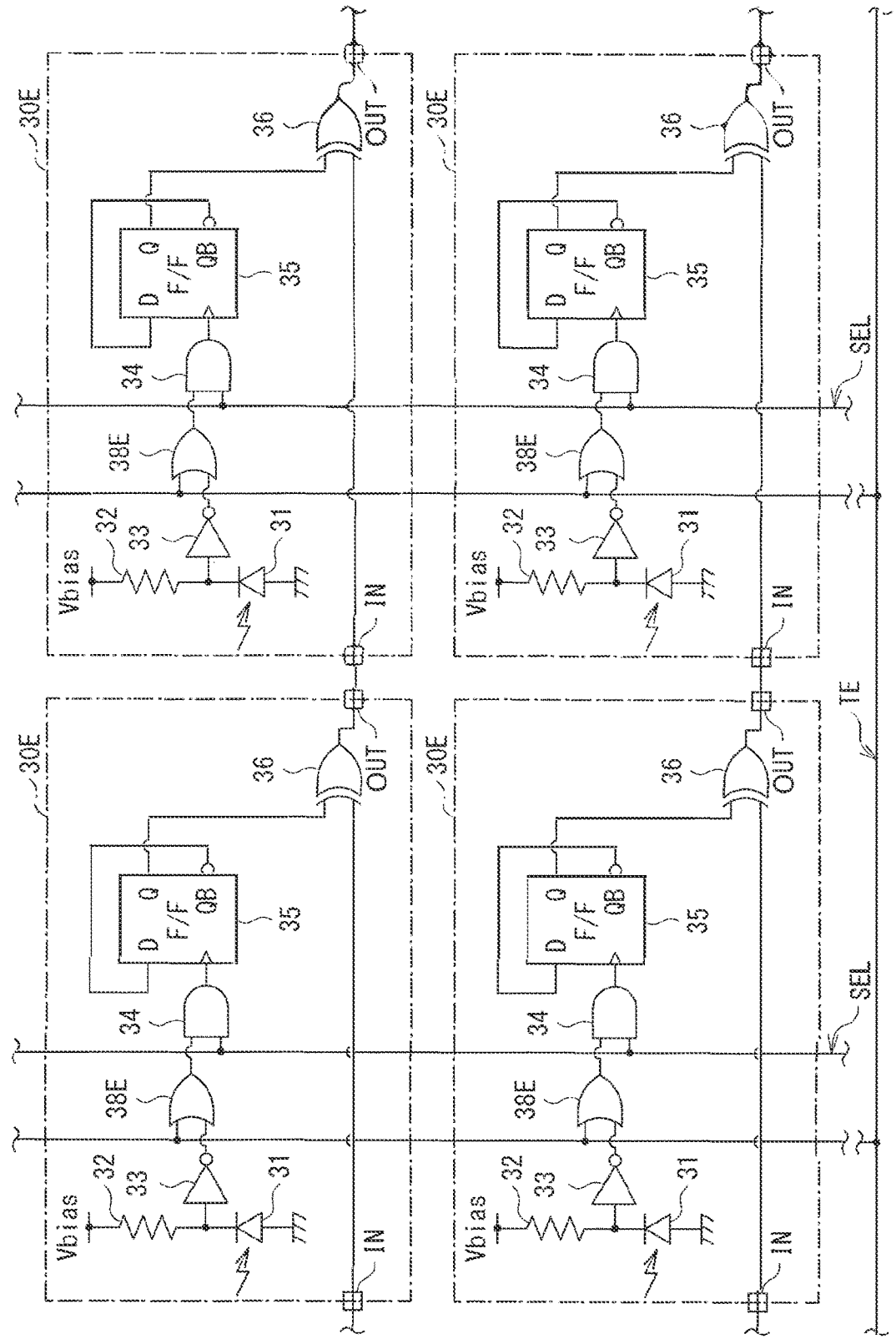
[Fig. 13]

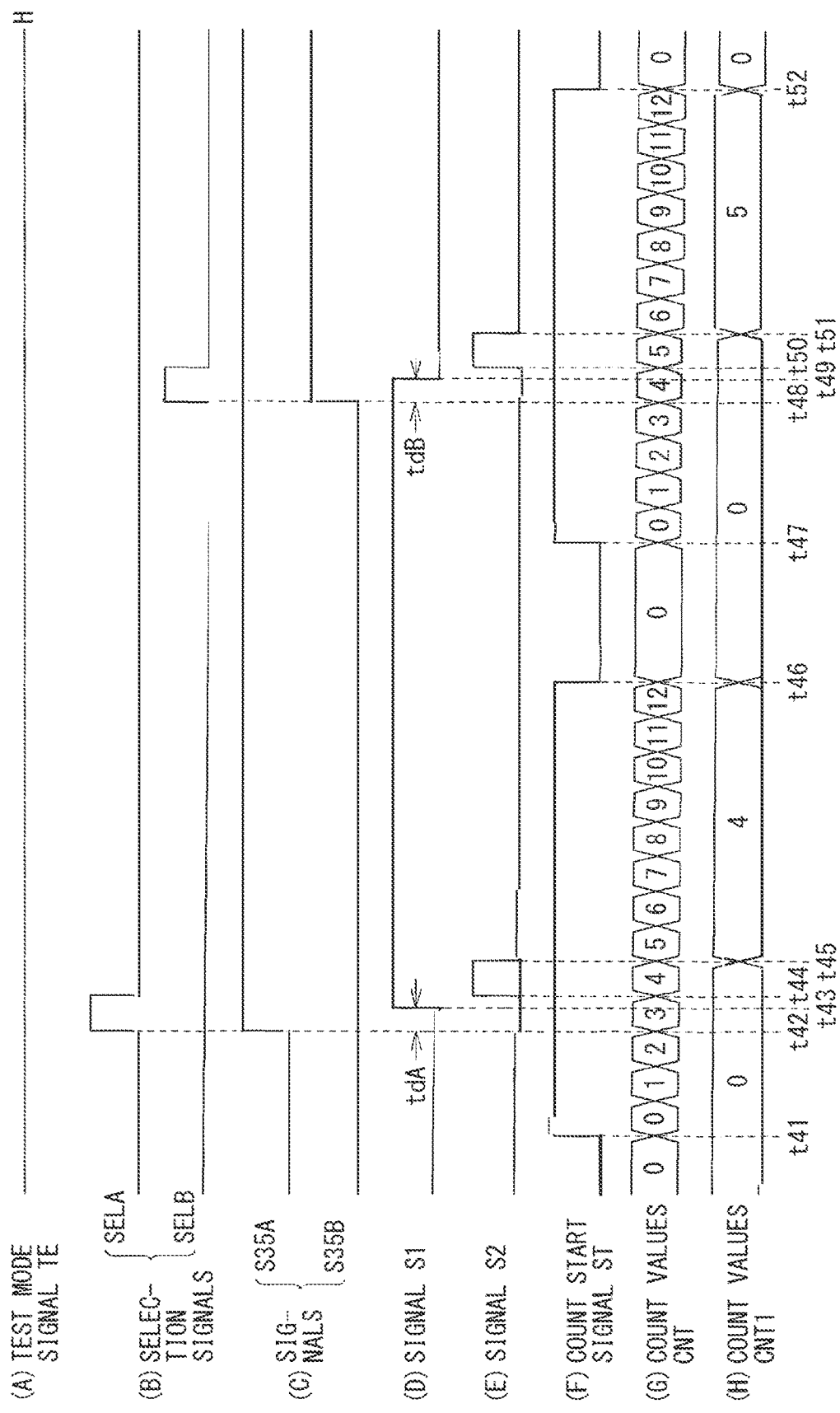

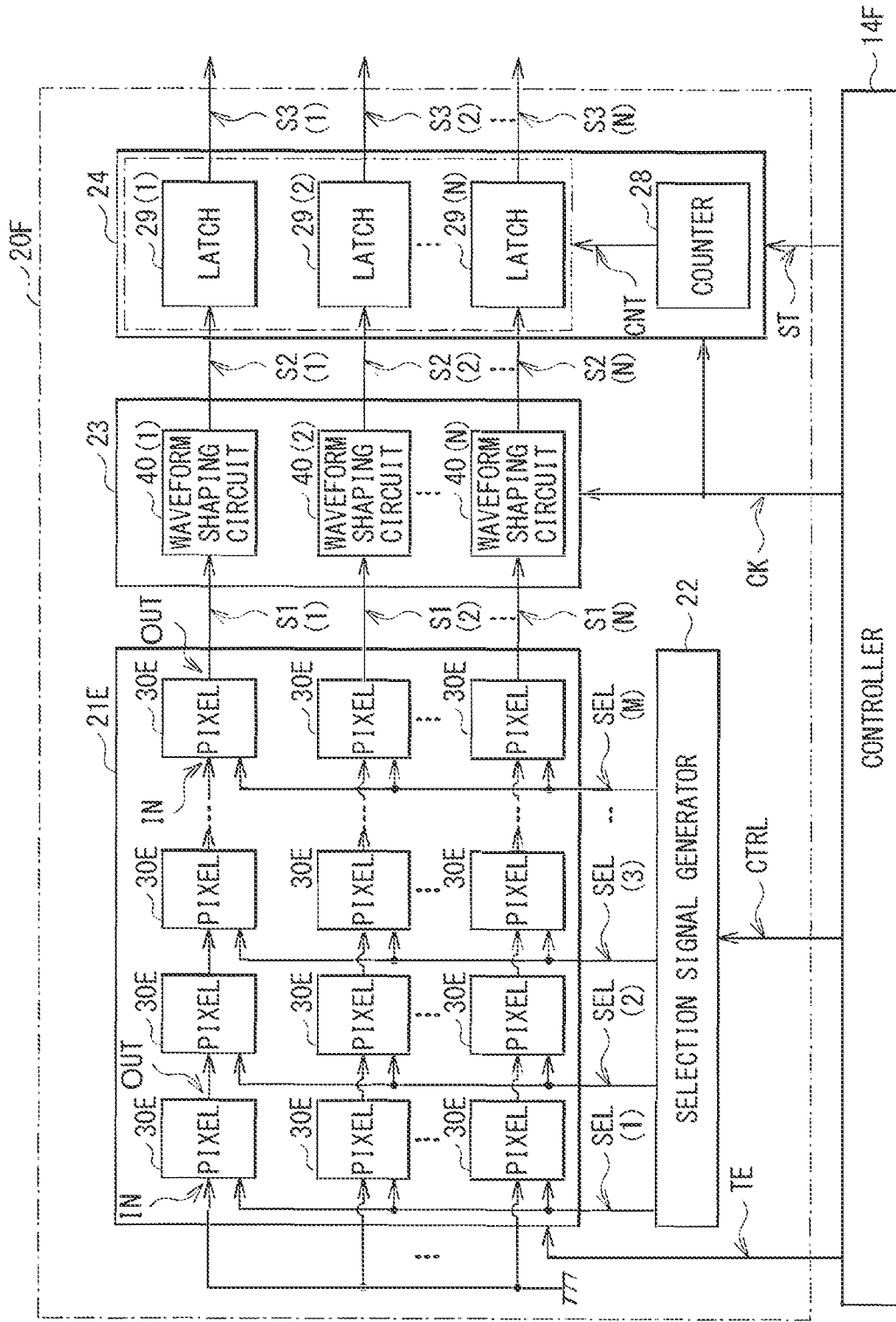
[Fig 15]

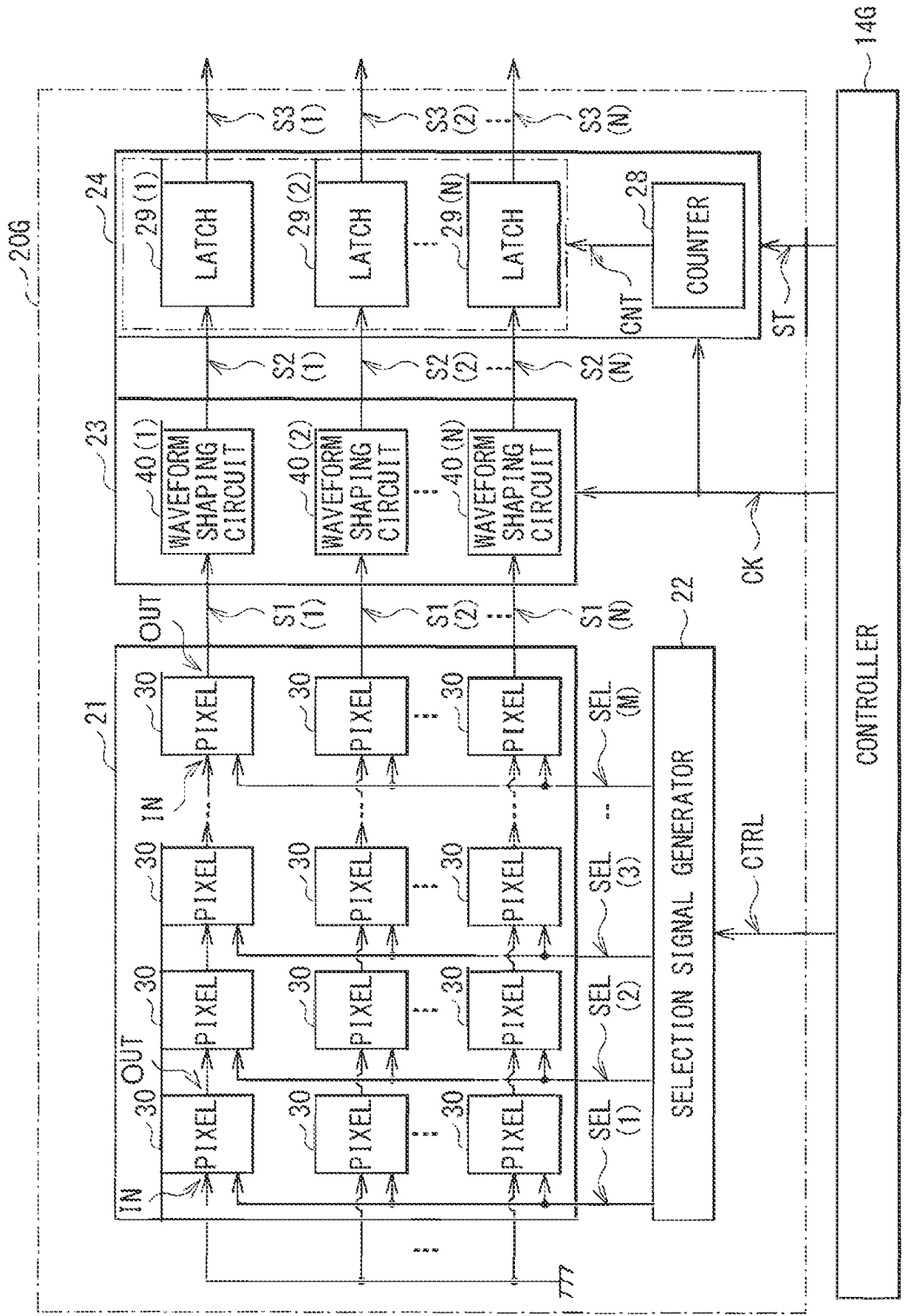
[Fig 16]

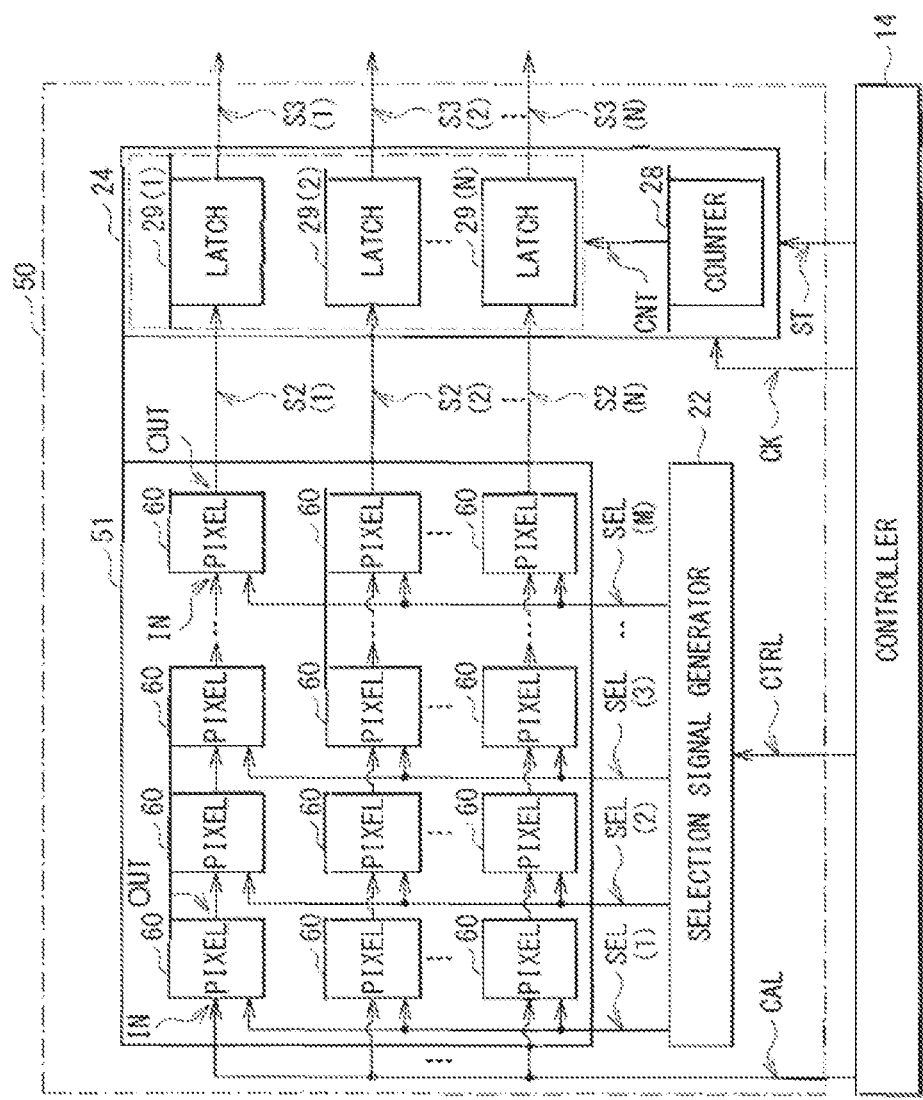
[Fig. 17]

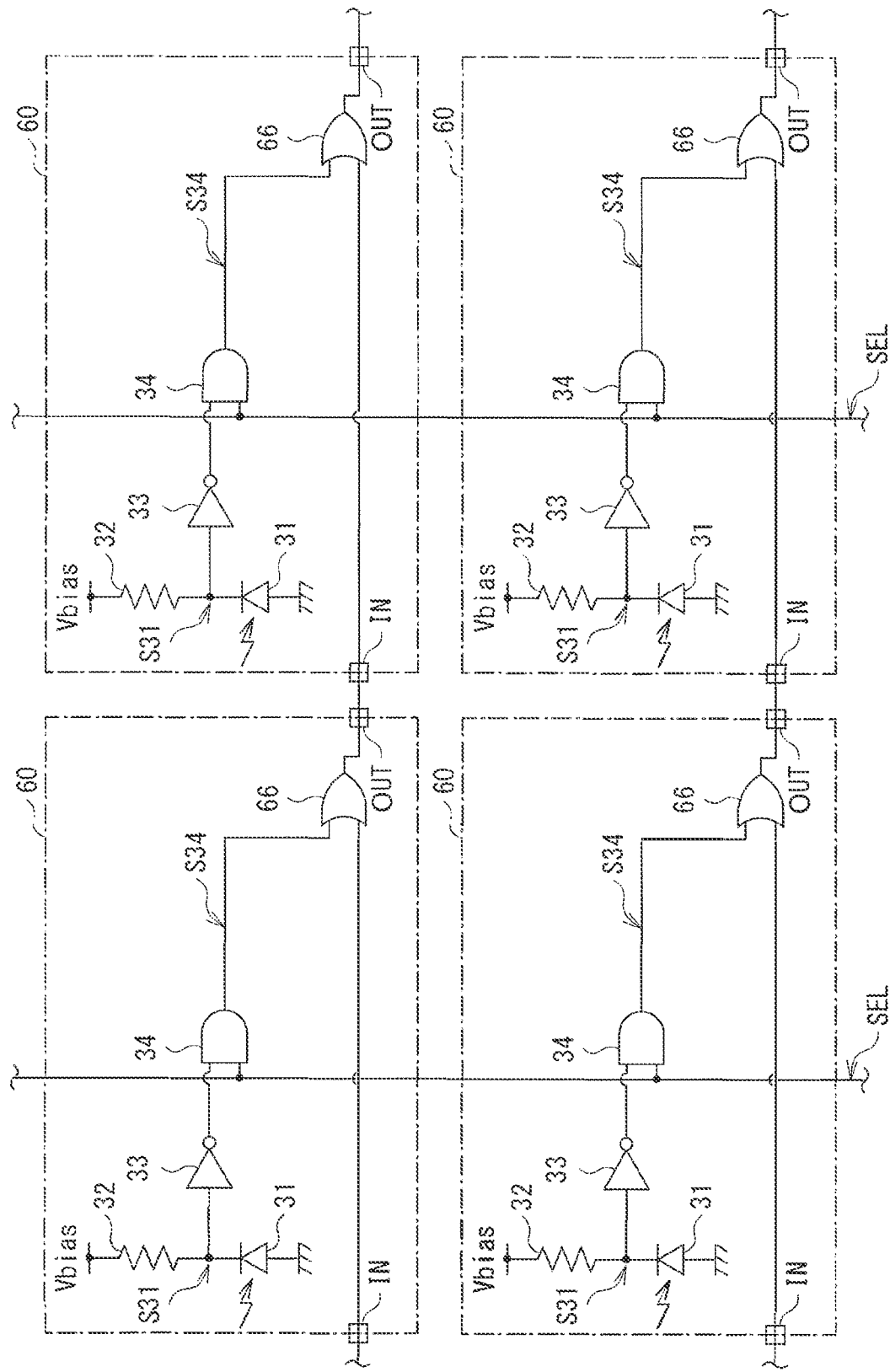
[Fig 18]

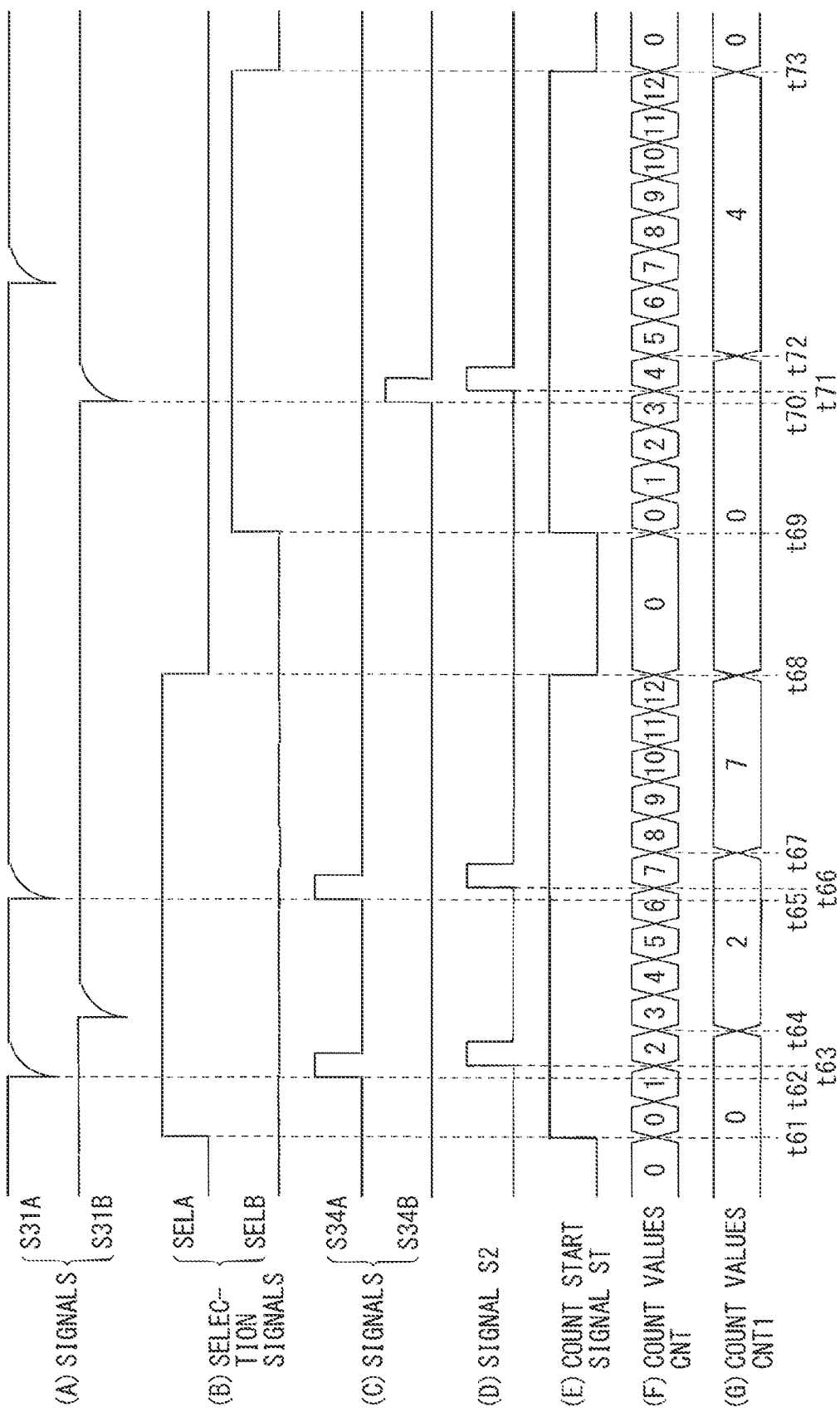

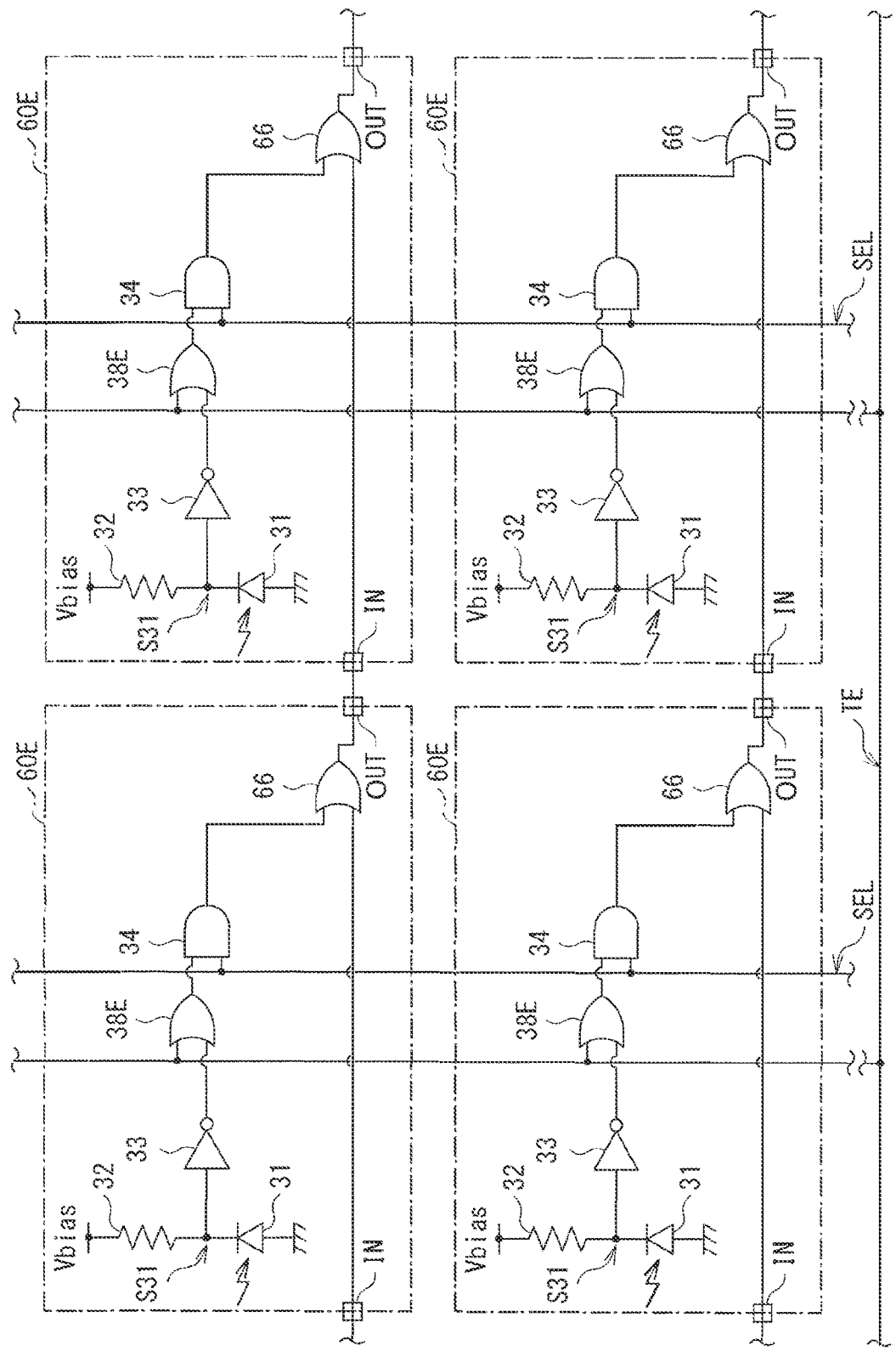
[Fig 20]

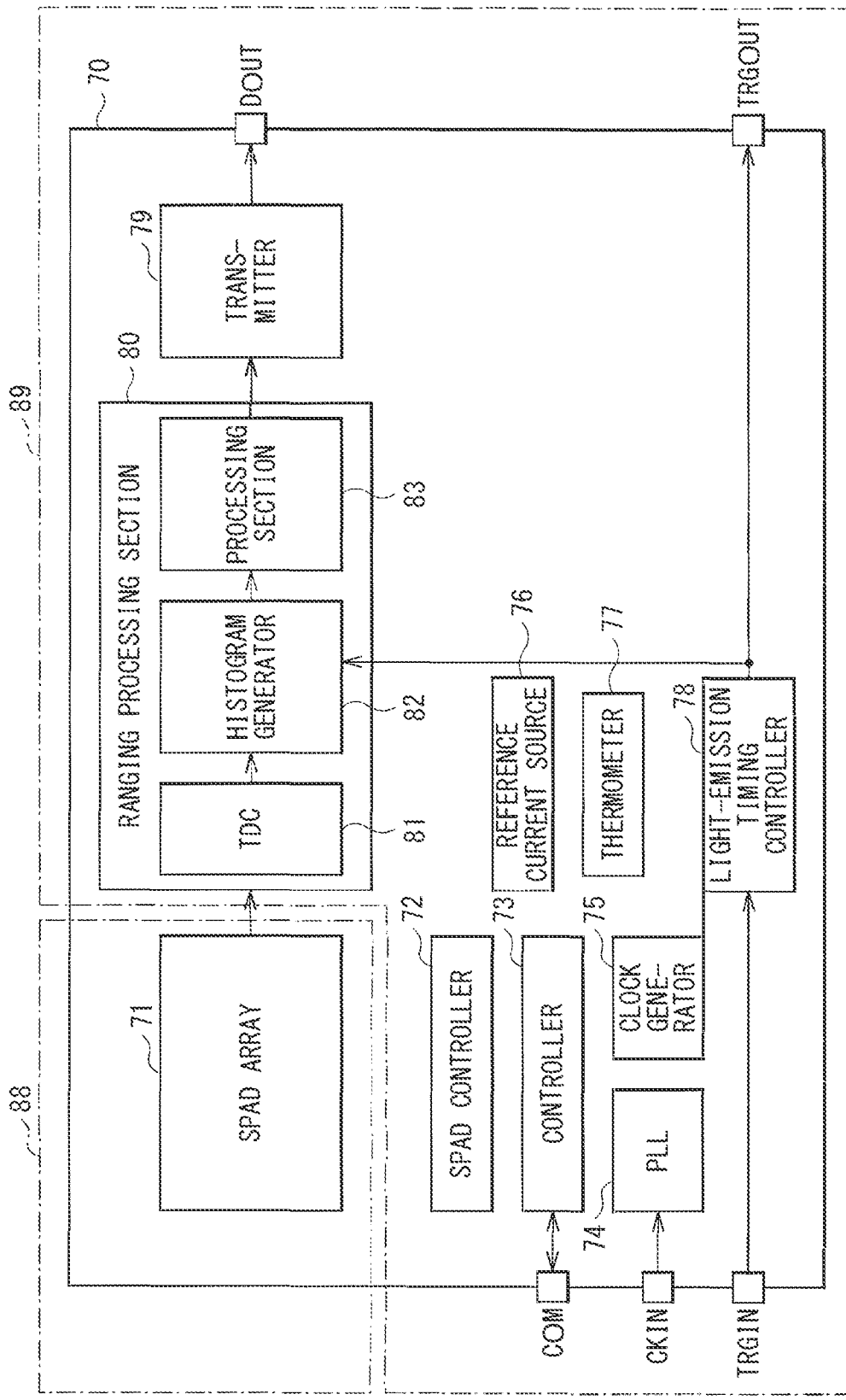

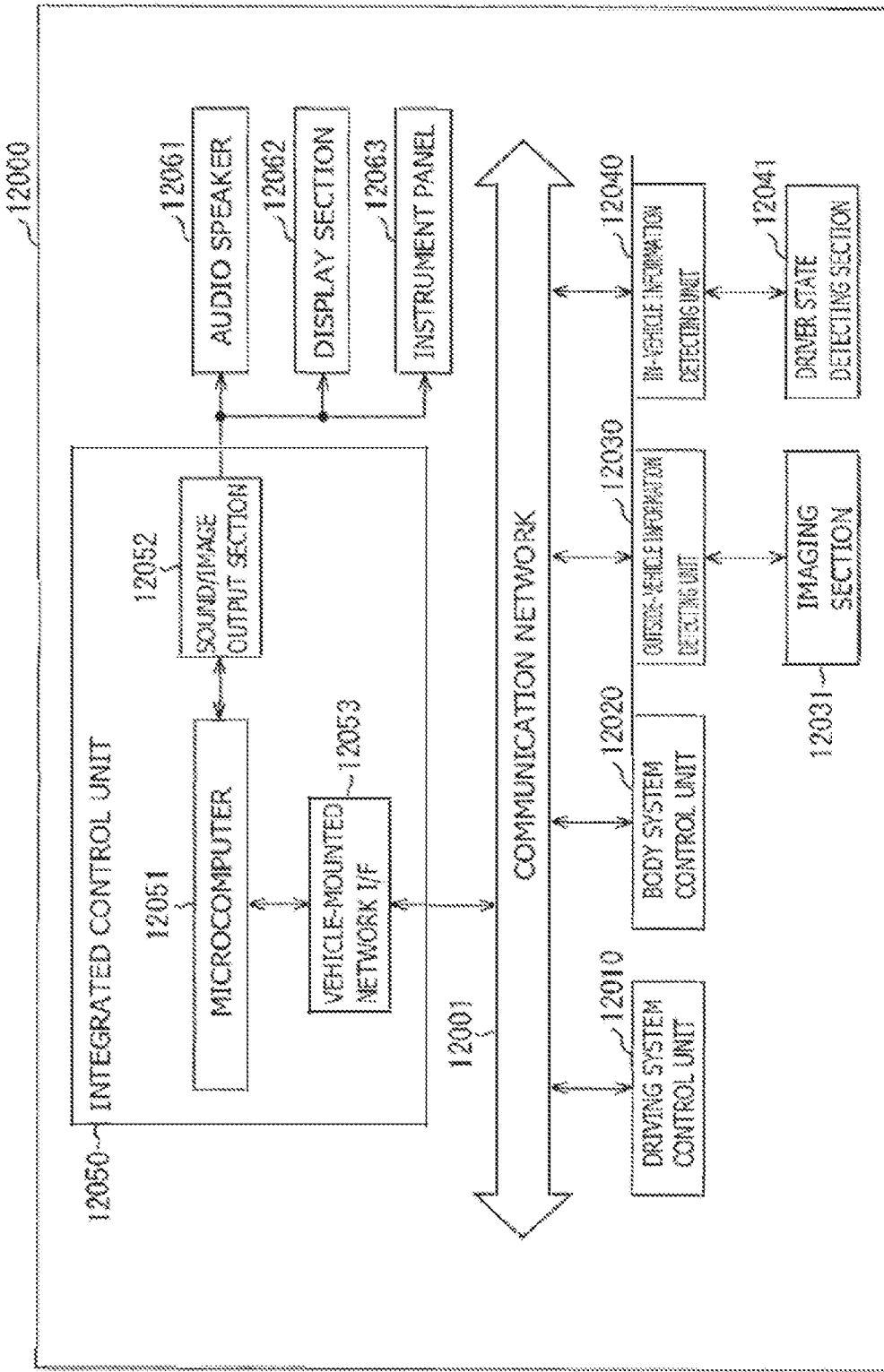
[Fig. 22]

[ FIG. 23 ]
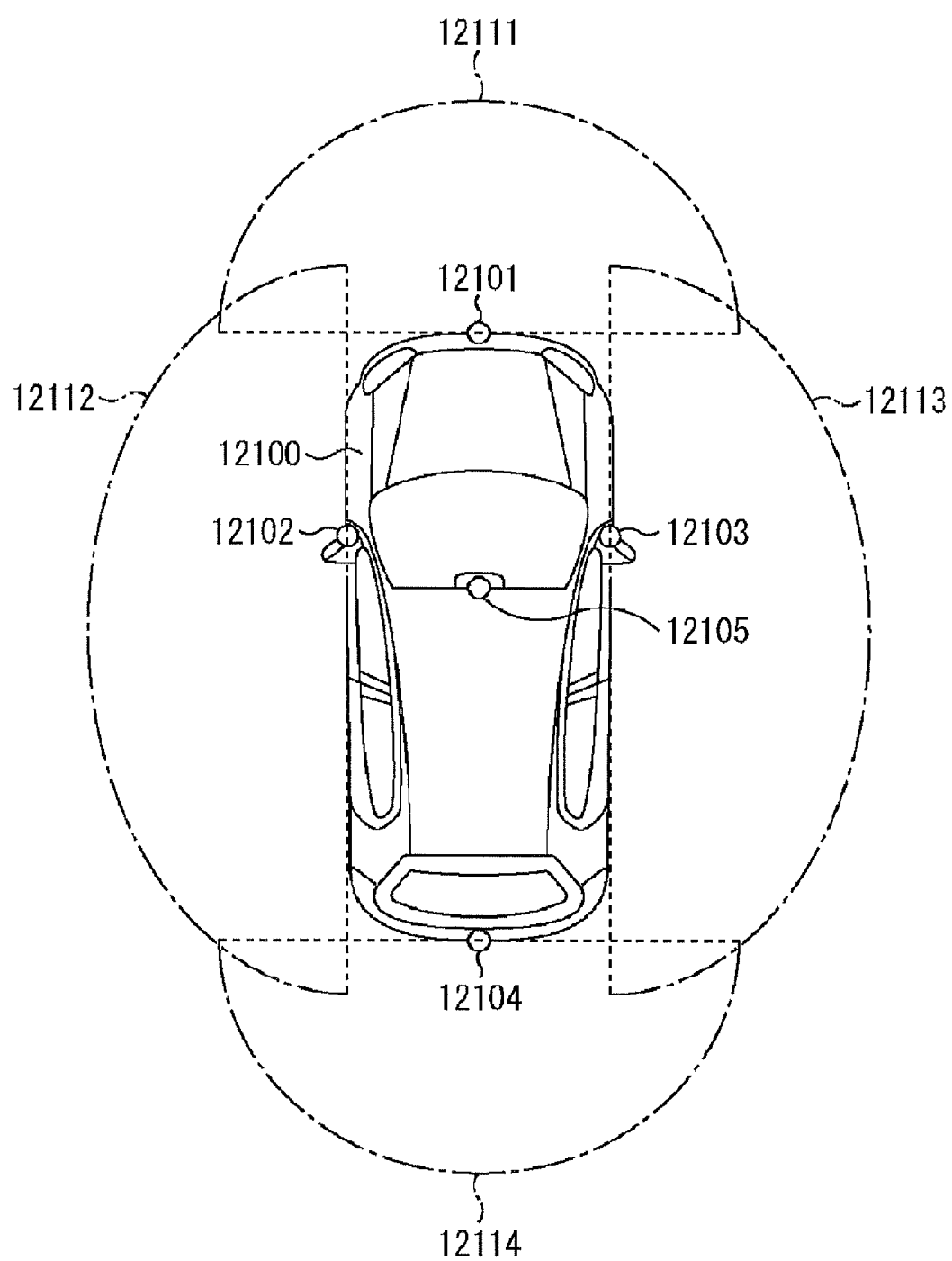

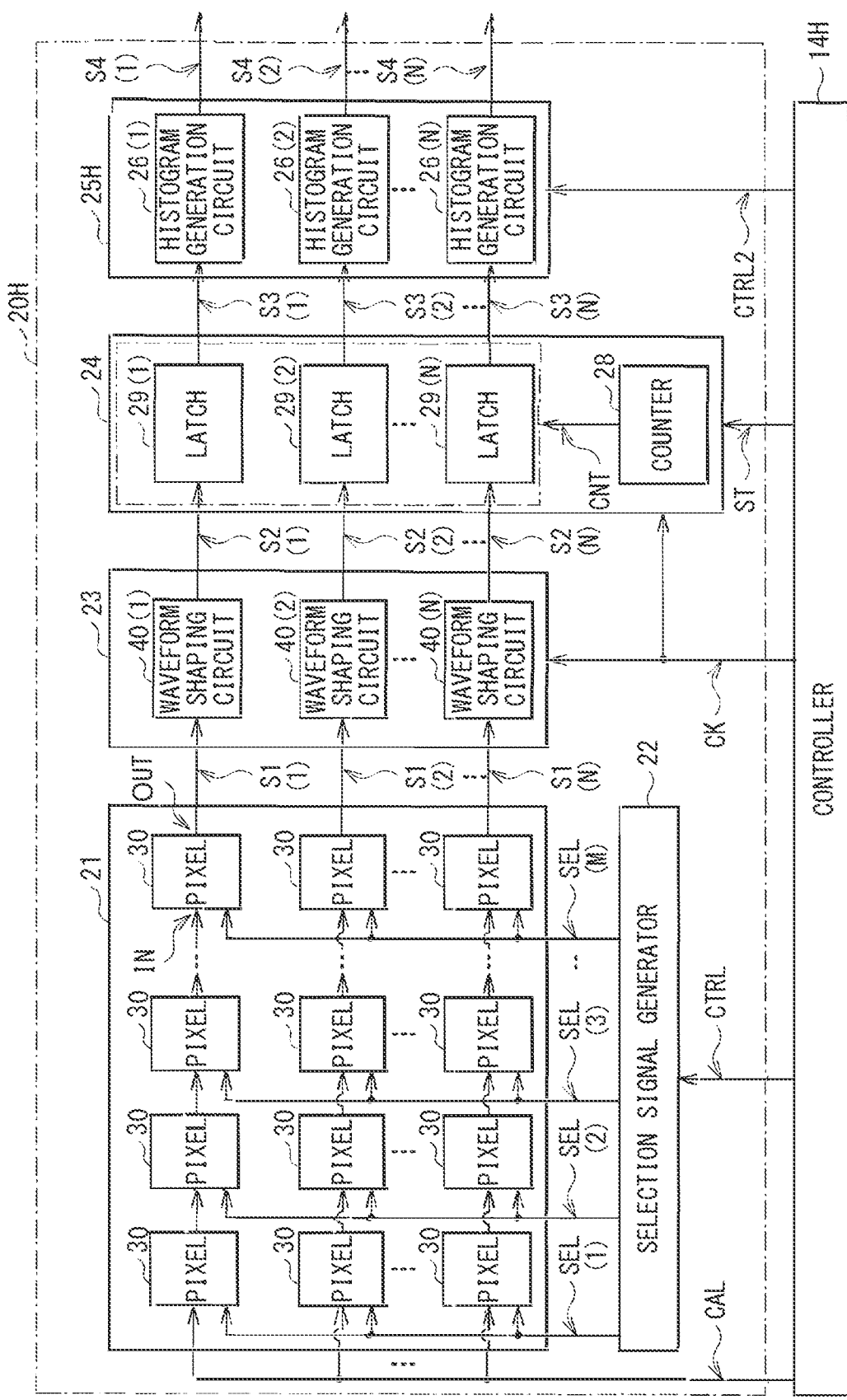
[Fig 24]

[ FIG. 25 ]
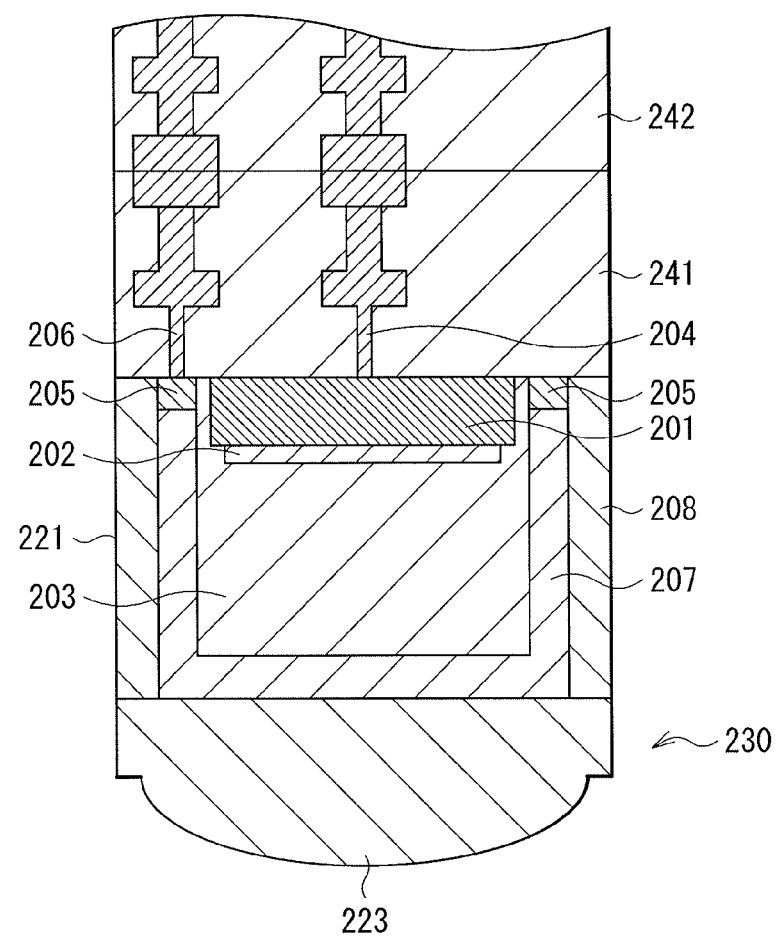

TIME MEASUREMENT DEVICE AND TIME MEASUREMENT UNIT

TECHNICAL FIELD

The present disclosure relates to a time measurement device and a time measurement unit that measure a time from timing of light emission until timing of light detection.

BACKGROUND ART

In measuring a distance to a measuring object, a TOF (Time Of Flight) method is often used. The TOF method emits light and also detects reflective light that is reflected by the measuring object. Subsequently, the TOF method measures a distance to the measuring object by measuring a time difference between timing of light emission and timing of detection of the reflective light (for example, see PTL 1).

CITATION LIST

Patent Literature

PTL 1: Japanese Unexamined Patent Application Publication No. 2015-78953

SUMMARY OF THE INVENTION

Incidentally, generally in a semiconductor device, it is desired to facilitate a circuit layout. Similarly, in a time measurement device as well, it is expected that a layout is achieved with ease.

It is desirable to provide a time measurement device and a time measurement unit that make it easy to achieve a layout.

A first time measurement device according to an embodiment of the present disclosure includes a plurality of pixels and a time measurement section. The plurality of pixels is provided side by side in a first direction, and each includes a single-photon avalanche diode disposed on a first semiconductor substrate, and each generates a first logic signal depending on detection timing in the single-photon avalanche diode. The time measurement section is disposed on a second semiconductor substrate attached to the first semiconductor substrate and measures the detection timing in each of the plurality of pixels. Pixels, other than a first pixel disposed on an end in the first direction and out of the plurality of pixels, each generates output signals on a basis of an output signal of a pixel other than relevant one of the pixels and on a basis of the first logic signals generated in the relevant one of the pixels, and the time measurement section measures the detection timing in each of the plurality of pixels on a basis of an output signal of a second pixel disposed on another end in the first direction out of the plurality of pixels.

A second time measurement device according to an embodiment of the present disclosure includes a plurality of pixels and a time measurement section. The plurality of pixels is provided side by side in a first direction, and each includes a light receiving element, and each generates a first logic signal depending on detection timing in the light receiving element. The time measurement section measures the detection timing in each of the plurality of pixels. Pixels, other than a first pixel disposed on an end in the first direction and out of the plurality of pixels, each generates output signals on a basis of an output signal of a pixel other than relevant one of the pixels and on a basis of the first logic signals generated in the relevant one of the pixels, and the time measurement section measures the detection timing in each of the plurality of pixels on a basis of an output signal of a second pixel disposed on another end in the first direction out of the plurality of pixels.

A third time measurement device according to an embodiment of the present disclosure includes a first pixel, a second pixel, a third pixel, and a time measurement section. Each of the first pixel, the second pixel, and the third pixel includes a single-photon avalanche diode disposed on a first semiconductor substrate, and generates a first logic signal depending on detection timing in the single-photon avalanche diode. The time measurement section is disposed on a second semiconductor substrate attached to the first semiconductor substrate and measures the detection timing in each of the first pixel, the second pixel, and the third pixel. The second pixel generates an output signal on a basis of an output signal of the first pixel and on a basis of the first logic signal generated in the second pixel, the third pixel generates an output signal on a basis of an output signal of the second pixel and on a basis of the first logic signal generated in the third pixel, and the time measurement section measures the detection timing in each of the first pixel, the second pixel, and the third pixel on a basis of an output signal of the third pixel.

A first time measurement unit according to an embodiment of the present disclosure includes a light-emitting section, a mirror, a plurality of pixels, and a time measurement section. The light-emitting section emits light. The mirror reflects reflective light corresponding to the light. The plurality of pixels is provided side by side in a first direction, and each includes a single-photon avalanche diode that is disposed on a first semiconductor substrate and detects the reflective light reflected by the mirror, and each generates a first logic signal depending on detection timing in the single-photon avalanche diode. The time measurement section is disposed on a second semiconductor substrate attached to the first semiconductor substrate and measures the detection timing in each of the plurality of pixels. Pixels, other than a first pixel disposed on an end in the first direction and out of the plurality of pixels, each generates output signals on a basis of an output signal of a pixel other than relevant one of the pixels and on a basis of the first logic signals generated in the relevant one of the pixels, and the time measurement section measures the detection timing in each of the plurality of pixels on a basis of an output signal of a second pixel disposed on another end in the first direction out of the plurality of pixels.

A second time measurement unit according to an embodiment of the present disclosure includes a light-emitting section, a mirror, a plurality of pixels, and a time measurement section. The light-emitting section emits light. The mirror reflects reflective light corresponding to the light. The plurality of pixels is provided side by side in a first direction, and each includes a light receiving element that detects the reflective light reflected by the mirror, and each generates a first logic signal depending on detection timing in the light receiving element. The time measurement section measures the detection timing in each of the plurality of pixels. Pixels, other than a first pixel disposed on an end in the first direction and out of the plurality of pixels, each generates output signals on a basis of an output signal of a pixel other than relevant one of the pixels and on a basis of the first logic signals generated in the relevant one of the pixels, and the time measurement section measures the detection timing in each of the plurality of pixels on a basis of an output signal of a second pixel disposed on another end in the first direction out of the plurality of pixels.

A third time measurement unit according to an embodiment of the present disclosure includes a light-emitting section, a mirror, a first pixel, a second pixel, a third pixel, and a time measurement section. The light-emitting section emits light. The mirror reflects reflective light corresponding to the light. Each of the first pixel, the second pixel, and the third pixel includes a single-photon avalanche diode that is disposed on a first semiconductor substrate and detects the reflective light reflected by the mirror, and generates a first logic signal depending on detection timing in the single-photon avalanche diode. The time measurement section is disposed on a second semiconductor substrate attached to the first semiconductor substrate and measures the detection timing in each of the first pixel, the second pixel, and the third pixel. The second pixel generates an output signal on a basis of an output signal of the first pixel and on a basis of the first logic signal generated in the second pixel, the third pixel generates an output signal on a basis of an output signal of the second pixel and on a basis of the first logic signal generated in the third pixel, and the time measurement section measures the detection timing in each of the first pixel, the second pixel, and the third pixel on a basis of an output signal of the third pixel.

In the first time measurement device and the first time measurement unit according to an embodiment of the present disclosure, in each of the pixels, light is detected by a single-photon avalanche diode disposed on the first semiconductor substrate, and the first logic signal depending on this detection timing is generated. In the pixels, other than the first pixel disposed on an end in the first direction and out of the plurality of pixels, output signals are generated on the basis of an output signal of a pixel other than relevant one of the pixels and on the basis of the first logic signals generated in the relevant one of the pixels. In the time measurement section disposed on the second semiconductor substrate, the detection timing in each of the plurality of pixels is measured on the basis of an output signal of the second pixel disposed on another end in the first direction out of the plurality of pixels.

In the second time measurement device and the second time measurement unit according to an embodiment of the present disclosure, in each of the pixels, light is detected by a light receiving element, and the first logic signal depending on this detection timing is generated. In the pixels, other than the first pixel disposed on an end in the first direction and out of the plurality of pixels, output signals are generated on the basis of an output signal of a pixel other than relevant one of the pixels and on the basis of the first logic signals generated in the relevant one of the pixels. In the time measurement section, the detection timing in each of the plurality of pixels is measured on the basis of an output signal of the second pixel disposed on another end in the first direction out of the plurality of pixels.

In the third time measurement device and the third time measurement unit according to an embodiment of the present disclosure, in each of the pixels, light is detected by a single-photon avalanche diode disposed on the first semiconductor substrate, and the first logic signal depending on this detection timing is generated. In the second pixel, an output signal is generated on the basis of an output signal of the first pixel and on the basis of the first logic signal generated in the second pixel. In the third pixel, an output signal is generated on the basis of the output signal of the second pixel and on the basis of the first logic signal generated in the third pixel. In the time measurement section disposed on the second semiconductor substrate, the detection timing in each of the first pixel, the second pixel, and the third pixel is measured on the basis of the output signal of the third pixel.

According to the first time measurement device, the second time measurement device, the first time measurement unit, and the second time measurement unit according to an embodiment of the present disclosure, the pixels, other than the first pixel disposed on an end in the first direction and out of the plurality of pixels, each generate output signals on the basis of an output signal of a pixel other than relevant one of the pixels and on the basis of the first logic signals generated in the relevant one of the pixels, and the time measurement section measures the detection timing in each of the plurality of pixels on the basis of an output signal of the second pixel disposed on another end in the first direction out of the plurality of pixels, which allows the layout to be achieved easily.

According to the third time measurement device and the third time measurement unit according to an embodiment of the present disclosure, the second pixel generates an output signal on the basis of an output signal of the first pixel and on the basis of the first logic signal generated in the second pixel, the third pixel generates an output signal on the basis of the output signal of the second pixel and on the basis of the first logic signal generated in the third pixel, and the time measurement section measures the detection timing in each of the first pixel, the second pixel, and the third pixel on the basis of the output signal of the third pixel, which allows the layout to be achieved easily.

It is to be noted that effects described above are not necessarily limitative, and any of effects described in the present disclosure may be provided.

BRIEF DESCRIPTION OF DRAWINGS

FIG. 1 is a configuration diagram of a configuration example of a time measurement unit according to an embodiment of the present disclosure.

FIG. 2 is a block diagram of a configuration example of a time measurement device according to a first embodiment.

FIG. 3 is a circuit diagram of a configuration example of pixels illustrated in FIG. 2.

FIG. 4 is a circuit diagram of a configuration example of a waveform shaping section and a time measurement section illustrated in FIG. 2.

FIG. 5 is a configuration diagram of a configuration example of a time measurement device illustrated in FIG. 1.

FIG. 6 is a timing waveform chart of an example of time measuring operation in a time measurement unit according to the first embodiment.

FIG. 7 is a waveform chart of an operation example of a light receiving element illustrated in FIG. 3.

FIG. 8 is a timing waveform chart of an operation example of the time measurement unit according to the first embodiment.

FIG. 9 is a timing waveform chart of an example of calibration operation in the time measurement unit according to the first embodiment.

FIG. 10 is a circuit diagram of a configuration example of a waveform shaping section and a time measurement section according to a modification example of the first embodiment.

FIG. 11 is a circuit diagram of a configuration example of pixels according to another modification example of the first embodiment.

FIG. 12 is a block diagram of a configuration example of a time measurement device according to another modification example of the first embodiment.

FIG. 13 is a circuit diagram of a configuration example of pixels illustrated in FIG. 12.

FIG. 14 is a timing waveform chart of an example of test operation in a time measurement unit according to another modification example of the first embodiment.

FIG. 15 is a block diagram of a configuration example of a time measurement device according to another modification example of the first embodiment.

FIG. 16 is a block diagram of a configuration example of a time measurement device according to another modification example of the first embodiment.

FIG. 17 is a block diagram of a configuration example of a time measurement device according to a second embodiment.

FIG. 18 is a circuit diagram of a configuration example of pixels illustrated in FIG. 17.

FIG. 19 is a timing waveform chart of an example of time measuring operation in a time measurement unit according to the second embodiment.

FIG. 20 is a circuit diagram of a configuration example of pixels according to a modification example of the second embodiment.

FIG. 21 is a block diagram of a configuration example of a distance measurement device according to an application example.

FIG. 22 is a block diagram depicting an example of schematic configuration of a vehicle control system.

FIG. 23 is a diagram of assistance in explaining an example of installation positions of an outside-vehicle information detecting section and an imaging section.

FIG. 24 is a configuration diagram of a configuration example of a time measurement device according to a modification example.

FIG. 25 is a cross-sectional view of a configuration example of an SPAD.

MODES FOR CARRYING OUT THE INVENTION

Hereinafter, some embodiments of the present disclosure are described in detail with reference to the drawings. It is to be noted that descriptions are given in the following order.
1. First Embodiment
2. Second Embodiment
3. Application Example
4. Example of Application to Mobile Object

1. First Embodiment

Configuration Example

FIG. 1 illustrates a configuration example of a time measurement unit (a time measurement unit 1) according to one embodiment. The time measurement unit 1 emits light and also detects reflective light that is reflected by a measuring object, and measures a time difference between timing of light emission and timing of detection of the reflective light. The time measurement unit 1 includes a light-emitting section 11, a diffusing lens 12, a light collecting mirror 13, a time measurement device 20, and a controller 14.

The light-emitting section 11 performs light-emitting operation to emit light in timing depending on a light-emitting control signal C1, and is configured with use of a pulse laser light source, for example.

The diffusing lens 12 diffuses the light emitted from the light-emitting section 11 within a range of predetermined angles. The light (output light L1) that is diffused by the diffusing lens 12 is outputted from the time measurement unit 1.

The light collecting mirror 13 reflects light (reflected light L2) that is reflected by a measuring object 9 to enter the time measurement unit 1 toward a light receiving surface S of the time measurement device 20. It is to be noted that the light collecting mirror 13 is not a necessary component part, but any configuration may be permitted as long as the reflected light L2 is reachable to the receiving surface S of the time measurement device 20.

The time measurement device 20 detects the light reflected by the light collecting mirror 13, and measures a time difference between timing when the light-emitting section 11 emits the light and timing when a light receiving element 31 (to be described later) of the time measurement device 20 detects the light.

The controller 14 controls operation of the light-emitting section 11 and the time measurement device 20. Specifically, the controller 14 controls the light-emitting operation of the light-emitting section 11 by providing the light-emitting control signal C1 to the light-emitting section 11. Further, the controller 14 controls operation of the time measurement device 20 by providing a variety of control signals (a calibration signal CAL, a selection control signal CTRL, a clock signal CK, and a count start signal ST to be described later) to the time measurement device 20.

FIG. 2 illustrates a configuration example of the time measurement device 20. It is to be noted that FIG. 2 illustrates also the controller 14 for the sake of convenience of description. The time measurement device 20 has a pixel array 21, a selection signal generator 22, a waveform shaping section 23, and a time measurement section 24.

The pixel array 21 has a plurality of pixels 30 disposed in a matrix pattern. In the pixel array 21, for example, the M (for example, 600) pixels 30 are disposed in a transverse direction in FIG. 2, and the N (for example, 150) pixels 30 are disposed in a longitudinal direction in FIG. 2. In this example, the number M of the pixels 30 arranged in the transverse direction is set up to be more than the number N of the pixels 30 arranged in the longitudinal direction. The number M of the pixels 30 arranged in the transverse direction is preferably 200 or more, for example. The number N of the pixels 30 arranged in the longitudinal direction is preferably 100 or more, for example.

FIG. 3 illustrates a configuration example of the pixels 30. FIG. 3 illustrates the four (=2×2) pixels 30 that are adjoining with respect to one another out of a plurality (M×N) of the pixels 30. The pixel 30 has a light receiving element 31, a resistor element 32, an inverter 33, an AND circuit 34, a flip-flop (F/F) 35, and an exclusive OR circuit 36.

The light receiving element 31 serves to detect light, and includes, for example, a single-photon avalanche diode (SPAD). A cathode of the light receiving element 31 is coupled to another end of the resistor element 32 and to an input terminal of the inverter 33, and an anode thereof is grounded. Preferably, the single-photon avalanche diode is caused to operate in a Geiger mode, for example. It is to be noted that the single-photon avalanche diode is used in this example; however, a photodetector is not limited thereto, and, as an alternative, for example, an avalanche photodiode (APD) may be used, or a high-sensitivity photodiode (PD) may be used.

A bias voltage Vbias is provided to one end of the resistor element 32, and the other end thereof is coupled to the cathode of the light receiving element 31 and to the input terminal of the inverter 33.

The input terminal of the inverter 33 is coupled to the other end of the resistor element 32 and to the cathode of the light receiving element 31, and another end thereof is coupled to a first input terminal of the AND circuit 34.

The AND circuit 34 obtains a logical product (AND) of a signal inputted to the first input terminal and a signal inputted to a second input terminal to output an obtained result from an output terminal. The first input terminal of the AND circuit 34 is coupled to an output terminal of the inverter 33; a selection signal SEL is provided to the second input terminal; and the output terminal is coupled to a clock input terminal of the flip-flop (F/F) 35.

The flip-flop (F/F) 35 is a D-type flip-flop, and samples a signal inputted to a data input terminal D on the basis of a rising edge of a signal inputted to the clock input terminal. The flip-flop (F/F) 35 outputs a sampling result from an output terminal Q, and also outputs an inverted signal of the sampling result from an inverting output terminal QB. The clock input terminal of the flip-flop (F/F) 35 is coupled to the output terminal of the AND circuit 34; the data input terminal D is coupled to the inverting output terminal QB; the output terminal Q is coupled to a first input terminal of the exclusive OR circuit 36; and the inverting output terminal QB is coupled to the data input terminal D. With such a configuration, the flip-flop (F/F) 35 performs toggle operation on the basis of the rising edge of a signal inputted to the clock input terminal.

The exclusive OR circuit 36 obtains an exclusive OR (ExOR) of a signal inputted to the first input terminal and a signal inputted to a second input terminal to output an obtained result from an output terminal. The first input terminal of the exclusive OR circuit 36 is coupled to the output terminal Q of the flip-flop (F/F) 35; the second input terminal is coupled to an input terminal IN of the pixel 30; and the output terminal is coupled to an output terminal OUT of the pixel 30.

As illustrated in FIG. 2, a calibration signal CAL provided from the controller 14 is inputted to the input terminal IN of the leftmost pixel 30 out of the M pixels 30 disposed side by side in a single row in the transverse direction. Further, the input terminals IN of the pixels 30 other than the leftmost pixel 30 out of the M pixels 30 are coupled to the output terminals OUT of the pixels 30 lying adjacent to the left sides thereof, as illustrated in FIG. 3. The output terminal OUT of the rightmost pixel 30 out of the M pixels 30 is coupled to the waveform shaping section 23, as illustrated in FIG. 2. The rightmost pixel 30 outputs a signal S1. Specifically, the rightmost pixel 30 out of the M pixels 30 in the first row outputs the signal S1 (1), and the rightmost pixel 30 out of the M pixels 30 in the second row outputs the signal S1 (2). The same is true for the third to Nth rows. Thus, in the pixel array 21, the M pixels 30 disposed side by side in a single row in the transverse direction in FIG. 2 are coupled to one another in a so-called daisy chain manner.

Further, the single selection signal SEL is provided to the N pixels 30 disposed side by side in a single column in the longitudinal direction, and the different selection signals SEL are provided to the pixels 30 belonging to columns that are different from one another. In other words, the corresponding selection signal SEL is provided to each of the M pixels 30 disposed side by side in the single row in the transverse direction. With such a configuration, in the pixel array 21, the plurality of pixels 30 is selected as a unit of the pixels 30 of a single column with use of the selection signal SEL.

The selection signal generator 22 generates the plurality of selection signals SEL (in this example, M selection signals SEL (1) to SEL (M)) on the basis of a selection control signal CTRL provided from the controller 14. The selection signal generator 22 provides the M selection signals SEL (1) to SEL (M) respectively to M columns of the pixels 30 in the pixel array 21. This allows the selection signal generator 22 to select the plurality of pixels 30 sequentially on each column basis.

The waveform shaping section 23 shapes waveforms of the plurality of signals S1 (in this example, N signals S1 (1) to S1 (N)) that are provided from the pixel array 21, thereby generating a plurality of signals S2 (in this example, N signals S2 (1) to S2 (N)), respectively. The waveform shaping section 23 has a plurality of waveform shaping circuits (in this example, N waveform shaping circuits 40 (1) to 40 (N)). The waveform shaping circuit 40 (1) generates the signal S2 (1) by shaping a waveform of the signal S1 (1), and the waveform shaping circuit 40 (2) generates the signal S2 (2) by shaping a waveform of the signal S1 (2). The same is true for the waveform shaping circuits 40 (3) to 40 (N). It is to be noted that the waveform shaping section 23 is not a necessary component part, but any configuration may be permitted as long as it is possible to accurately transmit that light is detected.

The time measurement section 24 performs time measuring operation on the basis of the plurality of signals S2 (in this example, the N signals S2 (1) to S2 (N)). The time measurement section 24 has a counter 28 and a plurality of latches 29 (in this example, N latches 29 (1) to 29 (N)). The counter 28 increments a count value CNT by performing operation of counting clock pulses of a clock signal CK. The latch 29 (1) generates a signal S3 (1) by latching the count value CNT on the basis of the signal S2 (1), and the latch 29 (2) generates a signal S3 (2) by latching the count value CNT on the basis of the signal S2 (2). The same is true for the latches 29 (3) to 29 (N).

FIG. 4 illustrates a configuration example of the waveform shaping section 23 and the time measurement section 24.

The waveform shaping circuit 40 of the waveform shaping section 23 has flip-flops (F/F) 42 and 43, as well as an exclusive OR circuit 44.

The flip-flops (F/F) 42 and 43 are D-type flip-flops. The clock signal CK is provided to a clock input terminal of the flip-flop (F/F) 42; the signal S1 is provided to a data input terminal D; and an output terminal Q is coupled to a first input terminal of the exclusive OR circuit 44 and to a data input terminal D of the flip-flop (F/F) 43. The clock signal CK is provided to a clock input terminal of the flip-flop (F/F) 43; a data input terminal D is coupled to the output terminal Q of the flip-flop (F/F) 42 and to the first input terminal of the exclusive OR circuit 44; and an output terminal Q is coupled to a second input terminal of the exclusive OR circuit 44.

The first input terminal of the exclusive OR circuit 44 is coupled to the output terminal Q of the flip-flop (F/F) 42 and to the data input terminal D of the flip-flop (F/F) 43, and the second input terminal is coupled to the output terminal Q of the flip-flop (F/F) 43.

With such a configuration, the waveform shaping circuit 40 detects transition of the signal S1 to generate a pulse of a time width identical to a cycle of the clock signal CK depending on the transition.

In the time measurement section 24, the clock signal CK is provided to a clock input terminal of the counter 28, and a count start signal ST is provided to a reset terminal RST. The counter 28 outputs the count value CNT from an output terminal using a signal of a plurality of bits (K bits in this example).

The latch 29 latches an N-bit signal (the count value CNT) inputted to a data input terminal D in timing depending on a signal inputted to an input terminal LD. The count value CNT is provided to the data input terminal of the latch 29; the signal S2 is provided to the input terminal LD; and the count start signal ST is provided to a reset terminal RST. The latch 29 outputs a latched count value (a count value CNT1) from an output terminal using a signal S3 of a plurality of bits (K bits in this example).

These elements and circuits of the time measurement device 20 are disposed on, for example, two semiconductor substrates.

FIG. 5 illustrates a configuration example of the time measurement device 20. In this example, the time measurement device 20 includes two overlaid semiconductor substrates 110 and 120. The semiconductor substrate 110 is provided with the light receiving elements 31 in the pixel array 21, and a surface on which the light receiving elements 31 are disposed serves as a light receiving surface S of the time measurement device 20. On the semiconductor substrate 120, in a region 121 corresponding to a region in which the light receiving elements 31 are disposed on the semiconductor substrate 110, the resistor elements 32 and circuits in the pixel array 21 are disposed. Further, in a region 122, the selection signal generator 22, the waveform shaping section 23, and the time measurement section 24 are disposed. The semiconductor substrate 110 and the semiconductor substrate 120 are electrically coupled to each other using, for example, Cu—Cu bonding.

Here, the pixel 30 corresponds to a specific example of a "pixel" in the present disclosure. An input signal applied to the first input terminal of the exclusive OR circuit 36 corresponds to a specific example of a "first logic signal" in the present disclosure. The exclusive OR circuit 36 corresponds to a specific example of a "first logic circuit" in the present disclosure. The AND circuit 34 corresponds to a specific example of a "second logic circuit" in the present disclosure. An output signal of the AND circuit 34 corresponds to a specific example of a "second logic signal" in the present disclosure. The flip-flop (F/F) 35 corresponds to a specific example of a "third logic circuit" in the present disclosure. The selection signal generator 22 corresponds to a specific example of a "control signal generator" in the present disclosure. The plurality of selection signals SEL corresponds to a specific example of "a plurality of first control signals" in the present disclosure. The calibration signal CAL corresponds to a specific example of a "third logic signal" in the present disclosure. The semiconductor substrate 110 corresponds to a specific example of a "first semiconductor substrate" in the present disclosure. The semiconductor substrate 120 corresponds to a specific example of a "second semiconductor substrate" in the present disclosure.

[Operation and Workings]

Next, the description is provided on operation and workings of the time measurement unit 1 of the present embodiment.

[Overview of Overall Operation]

First, with reference to FIGS. 1 and 2, the description is provided on an overview of overall operation of the time measurement unit 1. The light-emitting section 11 performs light-emitting operation to emit light in timing depending on the light-emitting control signal C1. The diffusing lens 12 diffuses the light emitted from the light-emitting section 11 within a range of predetermined angles. The light (the output light L1) that is diffused by the diffusing lens 12 is outputted from the time measurement unit 1. The light collecting mirror 13 reflects the light (the reflected light L2) that is reflected by the measuring object 9 to enter the time measurement unit 1 toward the light receiving surface S of the time measurement device 20. The time measurement device 20 detects the light reflected by the light collecting mirror 13, and measures a time difference between timing when the light-emitting section 11 emits the light and timing when the light receiving element 31 detects the light. The controller 14 controls the light-emitting operation of the light-emitting section 11 by providing the light-emitting control signal C1 to the light-emitting section 11, and controls operation of the time measurement device 20 by providing the calibration signal CAL, the selection control signal CTRL, the clock signal CK, and the count start signal ST to the time measurement device 20.

[Details of Operation]

Next, with a focus on two pixels 30A and 30B lying adjacent to each other in the transverse direction out of the M pixels 30 belonging to one row in the pixel array 21, the detailed description is provided on operation of the time measurement unit 1.

FIG. 6 illustrates an example of time measuring operation in the time measurement unit 1. (A) illustrates waveforms of signals S31A and S31B to be outputted from the respective light receiving elements 31 in the pixels 30A and 30B; (B) illustrates waveforms of the selection signals SEL (selection signals SELA and SELB) to be respectively provided to the pixels 30A and 30B; (C) illustrates waveforms of signals S35A and S35B to be outputted from the respective flip-flops (F/F) 35 in the pixels 30A and 30B; (D) illustrates a waveform of the signal S1 to be provided to the waveform shaping circuit 40 corresponding to the pixels 30A and 30B; (E) illustrates a waveform of the signal S2 to be outputted from the waveform shaping circuit 40 corresponding to the pixels 30A and 30B; (F) illustrates a waveform of the count start signal ST; (G) illustrates a count value CNT; and (H) illustrates a count value CNT1 that is indicated by the signal S3 to be outputted from the latch 29 corresponding to the pixels 30A and 30B. In this time measuring operation, a voltage of the calibration signal CAL is fixed to a low level or a high level.

At the beginning, in timing t1, when the light-emitting section 11 emits light on the basis of the light-emitting control signal C1, the controller 14 causes a voltage of the count start signal ST to be changed from the low level to the high level (FIG. 6 (F)). As a result, in this timing t1, the counter 28 of the time measurement section 24 starts operation of counting clock pulses to increment the count value CNT sequentially from this timing t1 onward (FIG. 6 (G)). At the same time, the selection signal generator 22 causes a voltage of the selection signal SELA that is provided to the pixel 30A to be changed from the low level to the high level on the basis of the selection control signal CTRL (FIG. 6 (B)). This leads to selection of the N pixels 30 including the pixel 30A that belong to a single column corresponding to the selection signal SELA.

Next, in this example, in timing t2, the light receiving element 31 of the pixel 30A detects light, and a voltage of a signal S31A to be outputted from the light receiving element 31 drops transiently (FIG. 6 (A)). Since the voltage of the selection signal SELA remains in the high level (FIG.

6 (B)), the flip-flop (F/F) 35 of the pixel 30A performs toggle operation, and a voltage of a signal S35A to be outputted from the flip-flop (F/F) 35 changes from the low level to the high level (FIG. 6 (C)). As a result, a voltage of the signal S1 to be provided to the waveform shaping circuit 40 corresponding to the pixels 30A and 30B changes from the low level to the high level (FIG. 6 (D)). It is to be noted that, in this example, a signal delay time from the pixel 30A to the waveform shaping circuit 40 is assumed to be zero for the sake of convenience of description.

On the basis of such transition of the signal S1, the waveform shaping circuit 40 causes a voltage of the signal S2 to be changed from the low level to the high level in timing t3, and causes the voltage of the signal S2 to be changed from the high level to the low level in timing t4 (FIG. 6 (E)).

The latch 29 corresponding to the pixels 30A and 30B latches a count value CNT on the basis of the signal S2, and outputs the latched count value ("2" in this example) as the count value CNT1 in timing t4 (FIGS. 6 (G) and (H)).

Further, in this example, in timing t5, the light receiving element 31 of the pixel 30A detects light, and a voltage of the signal S31A to be outputted from the light receiving element 31 drops transiently (FIG. 6 (A)). Since the voltage of the selection signal SELA remains in the high level (FIG. 6 (B)), the flip-flop (F/F) 35 of the pixel 30A performs toggle operation, and a voltage of the signal S35A to be outputted from the flip-flop (F/F) 35 changes from the high level to the low level (FIG. 6 (C)). As a result, a voltage of the signal S1 to be provided to the waveform shaping circuit 40 corresponding to the pixels 30A and 30B changes from the high level to the low level (FIG. 6 (D)). On the basis of such transition of the signal S1, the waveform shaping circuit 40 causes a voltage of the signal S2 to be changed from the low level to the high level in timing t6, and causes the voltage of the signal S2 to be changed from the high level to the low level in timing t7 (FIG. 6 (E)). The latch 29 corresponding to the pixels 30A and 30B latches a count value CNT on the basis of the signal S2, and outputs the latched count value ("7" in this example) as the count value CNT1 in timing t7 (FIGS. 6 (G) and (H)).

It is to be noted that, in this example, in timing between timing t2 and timing t5, the light receiving element 31 of the pixel 30B detects light, and a voltage of a signal S31B to be outputted from the light receiving element 31 drops transiently (FIG. 6 (A)). However, in this example, since a voltage of the selection signal SELB is in the low level (FIG. 6 (B)), and the pixel 30B is not selected, the flip-flop (F/F) 35 of the pixel 30B performs no toggle operation. Consequently, a voltage of a signal S35B to be outputted from the flip-flop (F/F) 35 remains in the low level in this example (FIG. 6 (C)).

Subsequently, in timing t8, the selection signal generator 22 causes a voltage of the selection signal SELA that is provided to the pixel 30A to be changed from the high level to the low level on the basis of the selection control signal CTRL (FIG. 6 (B)). This clears selection of the N pixels 30 including the pixel 30A that belong to a single column corresponding to the selection signal SELA. At the same time, the controller 14 causes a voltage of the count start signal ST to be changed from the high level to the low level (FIG. 6 (F)). As a result, in this timing t8, the counter 28 of the time measurement section 24 finishes operation of counting clock pulses to reset the count value CNT to zero (FIG. 6 (G)). Further, the latch 29 resets the count value CNT1 to zero (FIG. 6 (H)).

In such a manner, the time measurement unit 1 obtains the two count values CNT1 ("2" and "7" in this example) corresponding to respective time differences, between timing t1 when the light-emitting section 11 emits light and timing t2 when the light receiving element 31 of the pixel 30A detects the light, and between timing t1 and timing t5 when the light receiving element 31 of the pixel 30A detects the light. The time measurement unit 1 outputs these count values CNT1.

Next, in timing t9, when the light-emitting section 11 emits light on the basis of the light-emitting control signal C1, the controller 14 causes a voltage of the count start signal ST to be changed from the low level to the high level (FIG. 6 (F)). As a result, in this timing t9, the counter 28 of the time measurement section 24 starts operation of counting clock pulses to increment the count value CNT sequentially from this timing t9 onward (FIG. 6 (G)). At the same time, the selection signal generator 22 causes a voltage of the selection signal SELB that is provided to the pixel 30B to be changed from the low level to the high level on the basis of the selection control signal CTRL (FIG. 6 (B)). This leads to selection of the N pixels 30 including the pixel 30B that belong to a single column corresponding to the selection signal SELB.

Next, in this example, in timing t10, the light receiving element 31 of the pixel 30B detects light, and a voltage of a signal S31B to be outputted from the light receiving element 31 drops transiently (FIG. 6 (A)). Since the voltage of the selection signal SELB is in the high level (FIG. 6 (B)), the flip-flop (F/F) 35 of the pixel 30B performs toggle operation, and a voltage of a signal S35B to be outputted from the flip-flop (F/F) 35 changes from the low level to the high level (FIG. 6 (C)). As a result, a voltage of the signal S1 to be provided to the waveform shaping circuit 40 corresponding to the pixels 30A and 30B changes from the low level to the high level (FIG. 6 (D)).

On the basis of such transition of the signal S1, the waveform shaping circuit 40 causes a voltage of the signal S2 to be changed from the low level to the high level in timing t11, and causes the voltage of the signal S2 to be changed from the high level to the low level in timing t12 (FIG. 6 (E)).

The latch 29 corresponding to the pixels 30A and 30B latches a count value CNT on the basis of the signal S2, and outputs the latched count value ("4" in this example) as the count value CNT1 in timing t12 (FIGS. 6 (G) and (H)).

It is to be noted that, in this example, from timing t10 onward, the light receiving element 31 of the pixel 30A detects light, and a voltage of the signal S31A to be outputted from the light receiving element 31 drops transiently (FIG. 6 (A)). However, in this example, since a voltage of the selection signal SELA is in the low level (FIG. 6 (B)), and the pixel 30A is not selected, the flip-flop (F/F) 35 of the pixel 30A performs no toggle operation. Consequently, a voltage of the signal S35A to be outputted from the flip-flop (F/F) 35 remains in the low level in this example (FIG. 6 (C)).

Subsequently, in timing t13, the selection signal generator 22 causes a voltage of the selection signal SELB that is provided to the pixel 30B to be changed from the high level to the low level on the basis of the selection control signal CTRL (FIG. 6 (B)). This clears selection of the N pixels 30 including the pixel 30B that belong to a single column corresponding to the selection signal SELB. At the same time, the controller 14 causes a voltage of the count start signal ST to be changed from the high level to the low level (FIG. 6 (F)). As a result, in this timing t13, the counter 28 of the time measurement section 24 finishes operation of counting clock pulses to reset the count value CNT to zero (FIG. 6 (G)). Further, the latch 29 resets the count value CNT1 to zero (FIG. 6 (H)).

In such a manner, the time measurement unit 1 obtains the count value CNT1 ("4" in this example) corresponding to a time difference between timing t9 when the light-emitting section 11 emits light and timing t10 when the light receiving element 31 of the pixel 30B detects the light, and outputs this count value CNT1.

In such a manner, the time measurement unit 1 is provided with the flip-flop (F/F) 35, on each of the pixels 30, that performs toggle operation each time the light receiving element 31 detects light, as well as the waveform shaping circuit 40 that converts transition of the signal S1 based on such toggle operation into pulses. As described below, this allows the time measurement unit 1 to reduce power consumption, and to achieve stable operation.

FIG. 7 illustrates a waveform of a signal S31 to be outputted from the light receiving element 31 in the pixel 30. FIG. 8 illustrates an operation example of the time measurement unit 1. (A) illustrates a waveform of a signal S34 to be outputted from the AND circuit 34 in the pixel 30; (B) illustrates a waveform of a signal S35 to be outputted from the flip-flop (F/F) 35; (C) illustrates a waveform of the signal S1 to be inputted to the waveform shaping circuit 40; (D) illustrates a waveform of the clock signal CK; (E) and (F) illustrate waveforms of signals S42 and S43 to be respectively outputted from flip-flops (F/F) 42 and 43 of the waveform shaping circuit 40; and (G) illustrates a waveform of the signal S2 to be outputted from the waveform shaping circuit 40.

As illustrated in FIG. 7, when light enters the light receiving element 31 in timing t19, electron-hole pairs are generated in the light receiving element 31. Subsequently, the generated electrons and holes are accelerated by an electric field, and the electron-hole pairs are formed one after another through impact ionization. In such a manner that the light receiving element 31 performs so-called avalanche amplification, a voltage of the signal S31 drops once from the bias voltage Vbias. Subsequently, the voltage of the signal S31 rises gradually to return to the bias voltage Vbias finally.

In response to such a voltage change, as illustrated in FIG. 8 (A), the AND circuit 34 in the pixel 30 generates the signal S34 having a pulse starting with timing 21 (FIG. 8 (A)). The flip-flop (F/F) 35 performs toggle operation on the basis of a rising edge of the signal S34 to cause a voltage of the signal S35 to be changed from the low level to the high level (FIG. 8 (B)). This causes a voltage of the signal S1 that is provided to the waveform shaping circuit 40 to be changed from the low level to the high level (FIG. 8 (C)).

The flip-flop (F/F) 42 of the waveform shaping circuit 40 samples the signal S1 on rising timing of the clock signal CK, thereby causing a voltage of the signal S42 to be changed from the low level to the high level in timing t22 (FIG. 8 (E)). The flip-flop (F/F) 43 samples the signal S42 on rising timing of the clock signal CK, thereby causing a voltage of the signal S43 to be changed from the low level to the high level in timing t23 (FIG. 8 (F)). On the basis of the signals S42 and S43, the exclusive OR circuit 44 causes a voltage of the signal S2 to be changed from the low level to the high level in timing t22, and causes the voltage of the signal S2 to be changed from the high level to the low level in timing t23.

In the above, operation in the timing between t21 and t23 is described as an example; however, the same is true for operation in timing between t24 and t26.

In such a manner, the time measurement unit 1 is provided with the flip-flop (F/F) 35, on each of the pixels 30, that performs toggle operation each time the light receiving element 31 detects light. For example, as compared with a case where the flip-flop (F/F) 35 is not provided, this makes it possible to reduce the number of times of signal transition in a path from the pixels 30 to the waveform shaping circuit 40, which allows for reduction in the power consumption.

Further, in this operation, since a pulse width PW of a pulse of the signal S34 to be outputted from the AND circuit 34 is determined by operation of the light receiving element 31 as described above, such a pulse width PW is likely to vary due to, for example, manufacturing variation or environmental variation. The time measurement unit 1 is provided with the flip-flop (F/F) 35, on each of the pixels 30, that performs the toggle operation, and therefore the pixels 30 output no narrow-width pulses, which allows for reduction in the possibility that circuit operation could become unstable. Further, the time measurement unit 1 is provided with the waveform shaping circuit 40 that converts transition of the signal S1 based on the toggle operation into pulses. As a result, the pulse width of a pulse of the signal S1 becomes a time width corresponding to a cycle of the clock signal CK, which allows for reduction in the possibility that the circuit operation could become unstable.

In the above descriptions, a signal delay time from each of the pixels 30 to the waveform shaping circuit 40 is assumed to be zero; however, there is a possibility that the delay time will occur in practice. The delay time is likely to vary due to manufacturing variation or environmental variation. In such a case, there is a possibility that the accuracy of a measurement result obtained by the time measuring operation (FIG. 6) could deteriorate. Therefore, the time measurement unit 1 makes it possible to measure a delay time td of signals from the leftmost pixel 30 in the pixel array 21 to the waveform shaping circuit 40 by performing calibration operation. Hereinafter, this operation is described in detail.

FIG. 9 illustrates an example of calibration operation in the time measurement unit 1. (A) illustrates a waveform of the calibration signal CAL; (B) illustrates respective waveforms of the selection signals SELA and SELB; (C) illustrates a waveform of the signal S1 to be provided to the waveform shaping circuit 40 corresponding to the pixels 30A and 30B; (D) illustrates a waveform of the signal S2 to be outputted from the waveform shaping circuit 40 corresponding to the pixels 30A and 30B; (E) illustrates a waveform of the count start signal ST; (F) illustrates a count value CNT; and (G) illustrates a count value CNT1 that is indicated by the signal S3 to be outputted from the latch 29 corresponding to the pixels 30A and 30B. In this calibration operation, voltages of the M selection signals SEL are each fixed to the low level, as illustrated in FIG. 9 (B).

At the beginning, in timing t31, the controller 14 causes a voltage of the count start signal ST to be changed from the low level to the high level (FIG. 9 (E)). As a result, in this timing t31, the counter 28 of the time measurement section 24 starts operation of counting clock pulses to increment the count value CNT sequentially from this timing t31 onward (FIG. 9 (F)).

At the same time, the controller 14 causes a voltage of the calibration signal CAL to be changed from the low level to the high level (FIG. 9 (A)). This causes a voltage of the signal S1 that is provided to the waveform shaping circuit 40 corresponding to the pixels 30A and 30B to be changed from the low level to the high level in timing t32 (FIG. 9 (C)). In other words, a time between timing t31 and timing t32 corresponds to the delay time td of signals from the leftmost pixel 30 in the pixel array 21 to the waveform shaping circuit 40.

On the basis of such transition of the signal S1, the waveform shaping circuit 40 causes a voltage of the signal S2 to be changed from the low level to the high level in timing t33, and causes the voltage of the signal S2 to be changed from the high level to the low level in timing t34 (FIG. 9 (D)). The latch 29 latches a count value CNT on the basis of the signal S2, and outputs the latched count value ("2" in this example) as the count value CNT1 in timing t34 (FIGS. 9 (F) and (G)).

Subsequently, in timing t35, the controller 14 causes a voltage of the count start signal ST to be changed from the high level to the low level (FIG. 9 (E)). As a result, in this timing t35, the counter 28 of the time measurement section 24 finishes operation of counting clock pulses to reset the count value CNT to zero (FIG. 9 (F)). Further, the latch 29 resets the count value CNT1 to zero (FIG. 9 (G)).

In such a manner, the time measurement unit 1 obtains the count value CNT1 ("2" in this example) corresponding to the delay time td of signals from the leftmost pixel 30 in the pixel array 21 to the waveform shaping circuit 40, and outputs the count value CNT1. This is true for operation in timing between t36 and t40.

As described above, in the time measurement unit 1, the calibration signal CAL is provided to an input terminal IN of the leftmost pixel 30 in the pixel array 21. This allows the time measurement unit 1 to measure the delay time td of signals from the leftmost pixel 30 in the pixel array 21 to the waveform shaping circuit 40. As a result, for example, a processing circuit (for example, an application processor or any other device) at a subsequent stage of the time measurement unit 1 determines a delay time of a signal from each of the pixels 30 to the waveform shaping circuit 40 on the basis of this measurement result, and corrects the measurement result obtained by the time measuring operation (FIG. 6) utilizing the determined delay time, thereby allowing the measurement accuracy to be enhanced. It is to be noted that, in this example, the processing circuit at a subsequent stage corrects the measurement result obtained by the time measuring operation; however, a method is not limited thereto, and the time measurement section 24 may correct the measurement result obtained by the time measuring operation.

Further, in the time measurement unit 1, the plurality of pixels 30 (the M pixels 30 in this example) is coupled to one another using the so-called daisy chain connection, which makes it possible to facilitate a layout. In other words, for example, in a case where a configuration is made to omit the exclusive OR circuit 36 from each of the M pixels 30, and to provide output signals of the M flip-flops (F/F) 35 to the waveform shaping circuit 40 through an AND circuit having, for example, M input terminals, this makes wiring complicated and causes to raise a possibility that it will be difficult to arrange a circuit layout. In particular, the difficulty with layout is likely to become prominent if the number of pixels increases above 200, for example. In contrast, in the time measurement unit 1, the plurality of pixels 30 (the M pixels 30 in this example) is coupled to one another using the so-called daisy chain connection, which makes it possible to simplify wiring, thereby allowing the layout to be achieved easily.

Further, in the time measurement unit 1, the time measurement device 20 is configured using the two overlaid semiconductor substrates 110 and 120, as illustrated in FIG. 5. Specifically, the light receiving elements 31 in the pixel array 21 are disposed on the semiconductor substrate 110, and the elements and circuits other than the light receiving elements 31 in the pixel array 21 are disposed on the semiconductor substrate 120. In this case, for example, the inverter 33, the AND circuit 34, the flip-flop (F/F) 35, and the exclusive OR circuit 36 are disposed on the semiconductor substrate 120, which makes it possible to reduce a possibility that a noise will propagate from these circuits to the light receiving elements 31. Similarly, for example, signal lines for transmitting the selection signals SEL or signal lines for transmitting signals through the M exclusive OR circuits 36 are also disposed on the semiconductor substrate 120, which makes it possible to reduce a possibility that a noise will propagate from these signal lines to the light receiving elements 31. Further, for example, the light receiving elements 31 are mainly disposed on the semiconductor substrate 110, which allows for an increase in an element size of the light receiving element 31. In addition, for example, the semiconductor substrate 110 is manufacturable using processes optimized for manufacturing the light receiving elements 31, and the semiconductor substrate 120 is manufacturable using processes optimized for manufacturing the circuits, which makes it possible to improve the characteristics of the time measurement device 20.

[Effects]

As described above, in the present embodiment, a plurality of pixels is coupled to one another using the so-called daisy chain connection, which makes it possible to facilitate the layout.

In the present embodiment, a flip-flop is provided on each of the pixels, which performs toggle operation each time a light receiving element detects light, and a waveform shaping circuit is also provided that converts transition of a signal based on such toggle operation into pulses, which makes it possible to reduce power consumption, and to achieve stable operation.

In the present embodiment, a calibration signal is provided to an input terminal of the leftmost pixel in a pixel array, which makes it possible to measure a delay time of signals from the leftmost pixel in the pixel array to the waveform shaping circuit, thereby allowing the measurement accuracy to be enhanced.

In the present embodiment, a time measurement device is configured using two overlaid semiconductor substrates, which makes it possible to reduce a possibility that a noise will be propagated to the light receiving element, and to increase an element size of the light receiving element. Further, the two semiconductor substrates are manufacturable using respective optimized processes, which allows the characteristics to be improved.

Modification Example 1-1

In the above-described embodiment, the time measurement device 20 is configured using the waveform shaping section 23 and the time measurement section 24 that are illustrated in FIG. 3; however, a configuration is not limited thereto. Hereinafter, a time measurement unit 1C according to the present modification example is described in detail. The time measurement unit 1C includes a time measurement device 20C. The time measurement device 20C has a waveform shaping section 23C and a time measurement section 24C.

FIG. 10 illustrates a configuration example of the waveform shaping section 23C and the time measurement section 24C. The waveform shaping section 23C has a plurality of waveform shaping circuits 40C (in this example, N waveform shaping circuits 40C (1) to 40C (N)). The waveform shaping circuit 40C has flip-flops (F/F) 41 to 43, and an exclusive OR circuit 44. In other words, in the waveform shaping circuit 40C, the flip-flop (F/F) 41 is added to the waveform shaping circuit 40 (FIG. 4) according to the above-described embodiment. The clock signal CK is provided to a clock input terminal of the flip-flop (F/F) 41; the signal S1 is provided to a data input terminal D; and an output terminal Q is coupled to a data input terminal D of the flip-flop (F/F) 42.

The time measurement section 24C has a counter 28, and a plurality of latches 29C (in this example, N latches 29C (1) to 29C (N)). The latch 29C operates on the basis of the clock signal CK to latch an N-bit signal (the count value CNT) inputted to a data input terminal D in timing depending on a signal inputted to an input terminal LD. The count value CNT is provided to the data input terminal of the latch 29C; the clock signal CK is provided to a clock input terminal; the signal S2 is provided to the input terminal LD; and the count start signal ST is provided to a reset terminal RST.

Modification Example 1-2

In the above-described embodiment, as illustrated in FIG. 3, an anode of the light receiving element 31 is grounded; however, this is not limitative. As an alternative, for example, as found in a pixel 30D illustrated in FIG. 11, a resistor element may be grounded. The pixel 30D has a light receiving element 31D, a resistor element 32D, and a buffer 37D. An anode of the light receiving element 31D is coupled to an end of the resistor element 32D and to an input terminal of the buffer 37D, and the bias voltage Vbias is provided to a cathode. The end of the resistor element 32D is coupled to the anode of the light receiving element 31D and to the input terminal of the buffer 37D, and a cathode is grounded. The input terminal of the buffer 37D is coupled to the anode of the light receiving element 31D and to the end of the resistor element 32D, and an output terminal is coupled to a first input terminal of an AND circuit 34.

Modification Example 1-3

In the above-described embodiment, a configuration is adopted that allows for measuring the delay time td of signals from the leftmost pixel 30 in the pixel array 21 to the waveform shaping circuit 40. In addition to this, for example, a configuration may be adopted that allows for measuring the delay time of signals from the respective pixels to the waveform shaping circuit 40. Hereinafter, a time measurement unit 1E according to the present modification example is described in detail. The time measurement unit 1E has a time measurement device 20E and a controller 14E.

FIG. 12 illustrates a configuration example of the time measurement device 20E. The time measurement device 20E has a pixel array 21E. The pixel array 21E has a plurality of pixels 30E disposed in a matrix pattern.

FIG. 13 illustrates a configuration example of the pixels 30E. The pixel 30E has an OR circuit 38E. The OR circuit 38E obtains a logical sum (OR) of a signal inputted to a first input terminal and a signal inputted to a second input terminal to output an obtained result from an output terminal. A test mode signal TE is inputted to the first input terminal of the OR circuit 38E; the second input terminal is coupled to an output terminal of an inverter 33; and the output terminal is coupled to a first input terminal of an AND circuit 34. The single test mode signal TE is provided to all the pixels 30E in the pixel array 21E. Here, the test mode signal TE corresponds to a specific example of a "second logic signal" in the present disclosure. Each of the OR circuit 38E and the AND circuit 34 corresponds to a specific example of a "fourth logic circuit" in the present disclosure.

The controller 14E also has a function of generating the test mode signal TE, as illustrated in FIG. 12.

Next, with a focus on two pixels 30A and 30B lying adjacent to each other in the transverse direction out of the M pixels 30E belonging to one row in the pixel array 21E, the detailed description is provided on operation of the time measurement unit 1E.

FIG. 14 illustrates an example of test operation in the time measurement unit 1E. (A) illustrates a waveform of the test mode signal TE; (B) illustrates waveforms of the selection signals SELA and SELB; (C) illustrates waveforms of the signals S35A and S35B to be outputted from respective flip-flops (F/F) 35 in the pixels 30A and 30B; (D) illustrates a waveform of the signal S1 to be provided to the waveform shaping circuit 40 corresponding to the pixels 30A and 30B; (E) illustrates a waveform of the signal S2 to be outputted from the waveform shaping circuit 40 corresponding to the pixels 30A and 30B; (F) illustrates a waveform of the count start signal ST; (G) illustrates a count value CNT; and (H) illustrates a count value CNT1 that is indicated by the signal S3 to be outputted from the latch 29 corresponding to the pixels 30A and 30B. In this test operation, a voltage of the test mode signal TE is fixed to the high level, as illustrated in FIG. 14 (A). It is to be noted that, in time measuring operation and calibration operation, the voltage of the test mode signal TE is fixed to the low level.

At the beginning, in timing t41, the controller 14E causes a voltage of the count start signal ST to be changed from the low level to the high level (FIG. 14 (F)). As a result, in this timing t41, the counter 28 of the time measurement section 24 starts operation of counting clock pulses to increment the count value CNT sequentially from this timing t41 onward (FIG. 14 (G)).

Next, in this example, in timing t42 when the count value CNT becomes "3", the selection signal generator 22 causes a voltage of the selection signal SELA that is provided to the pixel 30A to be changed from the low level to the high level on the basis of the selection control signal CTRL, and, in subsequent timing, causes the voltage of the selection signal SELA to be changed from the high level to the low level (FIG. 14 (B)). This causes the flip-flop (F/F) 35 of the pixel 30A to perform toggle operation, and a voltage of the signal S35A to be outputted from the flip-flop (F/F) 35 changes from the low level to the high level (FIG. 14 (C)). As a result, a voltage of the signal S1 to be provided to the waveform shaping circuit 40 corresponding to the pixels 30A and 30B changes from the low level to the high level in timing t43 (FIG. 14 (D)). In other words, a time between timing t42 and timing t43 corresponds to a delay time tdA of signals from the pixel 30A to the waveform shaping circuit 40.

On the basis of such transition of the signal S1, the waveform shaping circuit 40 causes a voltage of the signal S2 to be changed from the low level to the high level in timing t44, and causes the voltage of the signal S2 to be changed from the high level to the low level in timing t45 (FIG. 14 (E)).

The latch 29 corresponding to the pixels 30A and 30B latches a count value CNT on the basis of the signal S2, and outputs the latched count value ("4" in this example) as the count value CNT1 in timing t45 (FIGS. 14 (G) and (H)).

Subsequently, in timing t46, the controller 14E causes a voltage of the count start signal ST to be changed from the high level to the low level (FIG. 14 (F)). As a result, in this timing t46, the counter 28 of the time measurement section 24 finishes operation of counting clock pulses to reset the count value CNT to zero (FIG. 14 (G)). Further, the latch 29 resets the count value CNT1 to zero (FIG. 14 (H)).

In such a manner, the time measurement unit 1E outputs the count value CNT1 ("4" in this example). It is to be noted that, in this example, the voltage of the selection signal SELA is caused to be changed from the low level to the high level in timing t42 when the count value CNT becomes "3", and therefore a count value corresponding to the delay time tdA of signals from the pixel 30A to the waveform shaping circuit 40 is "1" that is obtained by subtracting this count value "3" from the count value CNT1 ("4" in this example).

Next, in timing t47, the controller 14E causes the voltage of the count start signal ST to be changed from the low level to the high level (FIG. 14 (F)). As a result, in this timing t41, the counter 28 of the time measurement section 24 starts operation of counting clock pulses to increment the count value CNT sequentially from this timing t47 onward (FIG. 14 (G)).

Next, in this example, in timing t48 when the count value CNT becomes "4", the selection signal generator 22 causes a voltage of the selection signal SELB that is provided to the pixel 30B to be changed from the low level to the high level on the basis of the selection control signal CTRL, and, in subsequent timing, causes the voltage of the selection signal SELB to be changed from the high level to the low level (FIG. 14 (B)). This causes the flip-flop (F/F) 35 of the pixel 30B to perform toggle operation, and a voltage of the signal S35B to be outputted from the flip-flop (F/F) 35 changes from the low level to the high level (FIG. 14 (C)). As a result, the voltage of the signal S1 to be provided to the waveform shaping circuit 40 corresponding to the pixels 30A and 30B changes from the high level to the low level in timing t49 (FIG. 14 (D)). In other words, a time between timing t48 and timing t49 corresponds to a delay time tdB of signals from the pixel 30B to the waveform shaping circuit 40.

On the basis of such transition of the signal S1, the waveform shaping circuit 40 causes the voltage of the signal S2 to be changed from the low level to the high level in timing t50, and causes the voltage of the signal S2 to be changed from the high level to the low level in timing t51 (FIG. 14 (E)).

The latch 29 corresponding to the pixels 30A and 30B latches a count value CNT on the basis of the signal S2, and outputs the latched count value ("5" in this example) as the count value CNT1 in timing t51 (FIGS. 14 (G) and (H)).

Subsequently, in timing t52, the controller 14E causes a voltage of the count start signal ST to be changed from the high level to the low level (FIG. 14 (F)). As a result, in this timing t46, the counter 28 of the time measurement section 24 finishes operation of counting clock pulses to reset the count value CNT to zero (FIG. 14 (G)). Further, the latch 29 resets the count value CNT1 to zero (FIG. 14 (H)).

In such a manner, the time measurement unit 1E outputs the count value CNT1 ("5" in this example). It is to be noted that, in this example, the voltage of the selection signal SELB is caused to be changed from the low level to the high level in timing t48 when the count value CNT becomes "4", and therefore a count value corresponding to the delay time tdB of signals from the pixel 30B to the waveform shaping circuit 40 is "1" that is obtained by subtracting this count value "4" from the count value CNT1 ("5" in this example).

As described above, in the time measurement unit 1E, the OR circuit 38E is provided on each of the pixels 30E, and the flip-flop (F/F) 35 performs the toggle operation on the basis of the selection signal SEL at the time of test operation. This allows the time measurement unit 1E to measure the delay time of signals from the respective pixels 30E to the waveform shaping circuit 40. Therefore, for example, a processing circuit (for example, an application processor or any other device) at a subsequent stage of the time measurement unit 1E utilizes a measured delay time to correct the measurement result obtained by the time measuring operation (FIG. 6), thereby allowing the measurement accuracy to be enhanced. It is to be noted that, in this example, the processing circuit at a subsequent stage corrects the measurement result obtained by the time measuring operation; however, this is not limitative, and the time measurement section 24 may correct the measurement result obtained by the time measuring operation.

In the time measurement unit 1E, the calibration signal CAL provided from the controller 14 is inputted to an input terminal IN of the leftmost pixel 30 out of the plurality of pixels 30E in the pixel array 21E; however, a configuration is not limited thereto. As an alternative, for example, like a time measurement device 20F of a time measurement unit 1F as illustrated in FIG. 15, a voltage of a predetermined level (the low level in this example) may be inputted to the input terminal IN of the leftmost pixel 30 out of the plurality of pixels 30E. The time measurement unit 1F has a controller 14F. The controller 14F omits a function of generating the calibration signal CAL from the controller 14E. In such a case as well, it is possible to measure the delay time of signals from the respective pixels 30E to the waveform shaping circuit 40, which allows the measurement accuracy to be enhanced.

Modification Example 1-4

In the above-described embodiment, the calibration signal CAL provided from the controller 14 is inputted to the input terminal IN of the leftmost pixel 30 out of the plurality of pixels 30 in the pixel array 21; however, a configuration is not limited thereto. As an alternative, for example, like a time measurement device 20G of a time measurement unit 1G as illustrated in FIG. 16, a voltage of a predetermined level (the low level in this example) may be inputted to the input terminal IN of the leftmost pixel 30 out of the plurality of pixels 30. The time measurement unit 1G is usable for an application where a signal delay time in the pixel array 21 does not have a significant influence on the measurement accuracy, for example. Further, for example, a processing circuit (for example, an application processor or any other device) at a subsequent stage of the time measurement unit 1G may utilize a delay time estimated at the time of design, a delay time actually measured during inspection prior to shipment, or any other delay time to correct the measurement result obtained by the time measuring operation (FIG. 6).

Other Modification Examples

Further, two or more of these modification examples may be combined.

2. Second Embodiment

Next, the description is provided on a time measurement unit 2 according to a second embodiment. The present embodiment configures a time measurement device with use of the pixel that includes no flip-flop (F/F) 35. It is to be noted that any component parts substantially the same as those in the time measurement unit 1 according to the above-described first embodiment are denoted with the same reference numerals, and the related descriptions are omitted as appropriate.

As illustrated in FIG. 1, the time measurement unit 2 has a time measurement device 50.

FIG. 17 illustrates a configuration example of the time measurement device 50. The time measurement device 50 has a pixel array S1, a selection signal generator 22, and a time measurement section 24. The pixel array S1 has a plurality of pixels 60 disposed in a matrix pattern.

FIG. 18 illustrates a configuration example of the pixels 60. The pixel 60 has a light receiving element 31, a resistor element 32, an inverter 33, an AND circuit 34, and an OR circuit 66. The OR circuit 66 obtains a logical sum (OR) of a signal inputted to a first input terminal and a signal inputted to a second input terminal to output an obtained result from an output terminal. The first input terminal of the OR circuit 66 is coupled to an output terminal of the AND circuit 34; the second input terminal is coupled to an input terminal IN of the pixel 60; and the output terminal is coupled to an output terminal OUT of the pixel 60. In other words, the pixel 60 omits the flip-flop (F/F) 35, and the exclusive OR circuit 36 is replaced with the OR circuit 66 in the pixel 30 (FIG. 3) according to the above-described first embodiment.

As illustrated in FIG. 17, the calibration signal CAL provided from the controller 14 is inputted to the input terminal IN of the leftmost pixel 60 out of the M pixels 60 disposed side by side in a single row in the transverse direction. Further, the input terminals IN of the pixels 60 other than the leftmost pixel 60 out of the M pixels 60 are coupled to the output terminals OUT of the pixels 60 lying adjacent to the left sides thereof, as illustrated in FIG. 18. The output terminal OUT of the rightmost pixel 60 out of the M pixels 60 is coupled to the time measurement section 24, as illustrated in FIG. 17. The rightmost pixel 60 outputs a signal S2. Specifically, the rightmost pixel 60 out of the M pixels 60 in the first row outputs the signal S2 (1), and the rightmost pixel 60 out of the M pixels 60 in the second row outputs the signal S2 (2). The same is true for the third to Nth rows.

Here, the pixel 60 corresponds to a specific example of a "pixel" in the present disclosure. An input signal to be applied to the first input terminal of the OR circuit 66 corresponds to a specific example of a "first logic signal" in the present disclosure. The OR circuit 66 corresponds to a specific example of a "first logic circuit" in the present disclosure.

Next, with a focus on two pixels 60A and 60B lying adjacent to each other in the transverse direction out of the M pixels 60 belonging to one row in the pixel array 51, the description is provided on operation of the time measurement unit 2.

FIG. 19 illustrates an example of time measuring operation in the time measurement unit 2. (A) illustrates waveforms of signals S31A and S31B to be outputted from the respective light receiving elements 31 in the pixels 60A and 60B; (B) illustrates waveforms of the selection signals SEL (selection signals SELA and SELB) to be respectively provided to the pixels 60A and 60B; (C) illustrates waveforms of signals S34A and S34B to be outputted from the respective AND circuits 34 in the pixels 60A and 60B; (D) illustrates a waveform of the signal S2 to be provided to the latch 29 corresponding to the pixels 60A and 60B; (E) illustrates a waveform of the count start signal ST; (F) illustrates a count value CNT; and (G) illustrates a count value CNT1 that is indicated by the signal S3 to be outputted from the latch 29 corresponding to the pixels 60A and 60B.

At the beginning, in timing t61, when the light-emitting section 11 emits light on the basis of the light-emitting control signal C1, the controller 14 causes a voltage of the count start signal ST to be changed from the low level to the high level (FIG. 19 (E)). As a result, in this timing t61, the counter 28 of the time measurement section 24 starts operation of counting clock pulses to increment the count value CNT sequentially from this timing t61 onward (FIG. 19 (F)). At the same time, the selection signal generator 22 causes a voltage of the selection signal SELA that is provided to the pixel 60A to be changed from the low level to the high level on the basis of the selection control signal CTRL (FIG. 19 (B)). This leads to selection of the N pixels 60 including the pixel 60A that belong to a single column corresponding to the selection signal SELA.

Next, in this example, in timing t62, the light receiving element 31 of the pixel 60A detects light, and a voltage of a signal S31A to be outputted from the light receiving element 31 drops transiently (FIG. 19 (A)). Since the voltage of the selection signal SELA is in the high level (FIG. 19 (B)), a voltage of a signal S34A to be outputted from the AND circuit 34 changes from the low level to the high level in this timing t62, and changes from the high level to the low level in subsequent timing (FIG. 19 (C)). As a result, a voltage of the signal S2 to be provided to the latch 29 corresponding to the pixels 60A and 60B changes from the low level to the high level in timing t63, and changes from the high level to the low level in subsequent timing (FIG. 19 (D)).

The latch 29 corresponding to the pixels 60A and 60B latches a count value CNT on the basis of the signal S2, and outputs the latched count value ("2" in this example) as the count value CNT1 in timing t64 (FIGS. 19 (F) and (G)).

Further, in this example, in timing t65, the light receiving element 31 of the pixel 60A detects light, and a voltage of the signal S31A to be outputted from the light receiving element 31 drops transiently (FIG. 19 (A)). Since the voltage of the selection signal SELA is the high level (FIG. 19 (B)), a voltage of a signal S34B to be outputted from the AND circuit 34 changes from the low level to the high level in this timing t65, and changes from the high level to the low level in subsequent timing (FIG. 19 (C)). As a result, a voltage of the signal S2 to be provided to the latch 29 corresponding to the pixels 60A and 60B changes from the low level to the high level in timing t66, and changes from the high level to the low level in subsequent timing (FIG. 19 (D)). The latch 29 corresponding to the pixels 60A and 60B latches a count value CNT on the basis of the signal S2, and outputs the latched count value ("7" in this example) as the count value CNT1 in timing t67 (FIGS. 19 (F) and (G)).

It is to be noted that, in this example, in timing between timing t62 and timing t65, the light receiving element 31 of the pixel 60B detects light, and a voltage of a signal S31B to be outputted from the light receiving element 31 drops transiently (FIG. 19 (A)). However, in this example, since a voltage of the selection signal SELB is in the low level (FIG. 19 (B)), and the pixel 60B is not selected, a voltage of the signal S34B to be outputted from the AND circuit 34 of the pixel 60B remains in the low level in this example (FIG. 19 (C)).

Subsequently, in timing t68, the selection signal generator 22 causes a voltage of the selection signal SELA that is provided to the pixel 60A to be changed from the high level to the low level on the basis of the selection control signal CTRL (FIG. 19 (B)). This clears selection of the N pixels 60 including the pixel 60A that belong to a single column corresponding to the selection signal SELA. At the same time, the controller 14 causes a voltage of the count start signal ST to be changed from the high level to the low level (FIG. 19 (E)). As a result, in this timing t68, the counter 28 of the time measurement section 24 finishes operation of counting clock pulses to reset the count value CNT to zero (FIG. 19 (F)). Further, the latch 29 resets the count value CNT1 to zero (FIG. 19 (G)).

In such a manner, the time measurement unit 2 obtains the two count values CNT1 ("2" and "7" in this example) corresponding to respective time differences, between timing t61 when the light-emitting section 11 emits light and timing t62 when the light receiving element 31 of the pixel 60A detects the light, and between the timing t61 and timing t65 when the light receiving element 31 of the pixel 60A detects the light. The time measurement unit 2 outputs these count values CNT1.

Next, in timing t69, when the light-emitting section 11 emits light on the basis of the light-emitting control signal C1, the controller 14 causes a voltage of the count start signal ST to be changed from the low level to the high level (FIG. 19 (E)). As a result, in this timing t69, the counter 28 of the time measurement section 24 starts operation of counting clock pulses to increment the count value CNT sequentially from this timing t69 onward (FIG. 19 (F)). At the same time, the selection signal generator 22 causes a voltage of the selection signal SELB that is provided to the pixel 60B to be changed from the low level to the high level on the basis of the selection control signal CTRL (FIG. 19 (B)). This leads to selection of the N pixels 60 including the pixel 60B that belong to a single column corresponding to the selection signal SELB.

Next, in this example, in timing t70, the light receiving element 31 of the pixel 60B detects light, and a voltage of a signal S31B to be outputted from the light receiving element 31 drops transiently (FIG. 19 (A)). Since the voltage of the selection signal SELB is in the high level (FIG. 19 (B)), a voltage of a signal S34B to be outputted from the AND circuit 34 changes from the low level to the high level in this timing t70, and changes from the high level to the low level in subsequent timing (FIG. 19 (C)). As a result, a voltage of the signal S2 to be provided to the latch 29 corresponding to the pixels 60A and 60B changes from the low level to the high level in timing t71, and changes from the high level to the low level in subsequent timing (FIG. 19 (D)).

The latch 29 corresponding to the pixels 60A and 60B latches a count value CNT on the basis of the signal S2, and outputs the latched count value ("4" in this example) as the count value CNT1 in timing t72 (FIGS. 19 (F) and (G)).

It is to be noted that, in this example, from timing t70 onward, the light receiving element 31 of the pixel 60A detects light, and a voltage of the signal S31A to be outputted from the light receiving element 31 drops transiently (FIG. 19 (A)). However, in this example, since a voltage of the selection signal SELA is in the low level (FIG. 19 (B)), and the pixel 60A is not selected, a voltage of the signal S34A to be outputted from the AND circuit 34 of the pixel 60A remains in the low level in this example (FIG. 19 (C)).

Subsequently, in timing t73, the selection signal generator 22 causes a voltage of the selection signal SELB that is provided to the pixel 60B to be changed from the high level to the low level on the basis of the selection control signal CTRL (FIG. 19 (B)). This clears selection of the N pixels 60 including the pixel 60B that belong to a single column corresponding to the selection signal SELB. At the same time, the controller 14 causes a voltage of the count start signal ST to be changed from the high level to the low level (FIG. 19 (E)). As a result, in this timing t73, the counter 28 of the time measurement section 24 finishes operation of counting clock pulses to reset the count value CNT to zero (FIG. 19 (F)). Further, the latch 29 resets the count value CNT1 to zero (FIG. 19 (G)).

In such a manner, the time measurement unit 2 obtains a count value CNT1 ("4" in this example) corresponding to a time difference between timing t69 when the light-emitting section 11 emits light and timing t70 when the light receiving element 31 of the pixel 60B detects the light, and outputs this count value CNT1.

Such a configuration also makes it possible to achieve effects similar to those obtained in a case of the above-described first embodiment.

In other words, in the present embodiment, a plurality of pixels is coupled to one another using the so-called daisy chain connection, which makes it possible to facilitate the layout.

In the present embodiment, a calibration signal is provided to an input terminal of the leftmost pixel in a pixel array, which makes it possible to measure a delay time of signals from the leftmost pixel in the pixel array to the waveform shaping circuit, thereby allowing the measurement accuracy to be enhanced.

In the present embodiment, a time measurement device is configured using two overlaid semiconductor substrates, which makes it possible to reduce a possibility that a noise will be propagated to the light receiving element, and to increase an element size of the light receiving element. Further, the two semiconductor substrates are manufacturable using respective optimized processes, which allows the characteristics to be improved.

Modification Example 2

Each of the modification examples of the above-described first embodiment may be applied to the time measurement unit 2 according to the above-described embodiment. FIG. 20 illustrates an example where the modification example 1-3 according to the above-described first embodiment is applied to the time measurement unit 2. A pixel 60E illustrated in FIG. 20 has the OR circuit 38E, as with the pixel 30E (FIG. 13) according to the above-described first embodiment. A test mode signal TE is inputted to a first input terminal of the OR circuit 38E; a second input terminal is coupled to an output terminal of an inverter 33; and an output terminal is coupled to a first input terminal of an AND circuit 34.

3. Application Example

Next, the description is provided on an application example of any of the time measurement devices according to the above-described embodiments.

FIG. 21 illustrates a configuration example of a distance measurement device 70 according to an application example 1. The distance measurement device 70 includes an SPAD array 71, an SPAD controller 72, a controller 73, a PLL (Phase Locked Loop) 74, a clock generator 75, a reference current source 76, a thermometer 77, a light-emission timing controller 78, a ranging processing section 80, and a transmitter 79.

The SPAD array 71 includes single-photon avalanche diodes (SPADs) disposed in a matrix pattern. The SPAD controller 72 controls operation of the SPAD array 71 on the basis of an instruction from the controller 73. The controller 73 controls operation of the distance measurement device 70. Further, the controller 73 has also a function of performing communication with an external device through a COM terminal using, for example, $I^2C$. The PLL 74 operates on the basis of an input clock provided through a CKIN terminal. The clock generator 75 generates one or a plurality of clock signals to be used in the distance measurement device 70. The reference current source 76 generates one or a plurality of reference currents to be used in the distance measurement device 70. The thermometer 77 detects temperature in the distance measurement device 70. The light-emission timing controller 78 controls light-emission timing on the basis of a light-emission trigger signal provided through a TRGIN terminal. The light-emission timing controller 78 generates the light-emission trigger signal to provide the resulting light-emission trigger signal to the ranging processing section 80, and also to output such a light-emission trigger signal through a TRGOUT terminal. The ranging processing section 80 generates a depth image on the basis of a detection result in the SPAD array 71. The ranging processing section 80 has a TDC (Time to Digital Converter) 81, a histogram generator 82, and a processing section 83. The TDC 81 converts light-receiving timing into a digital value on the basis of a detection result in the SPAD array 71. The histogram generator 82 generates a histogram on the basis of the digital value obtained from the TDC 81. The processing section 83 performs a variety of processing on the basis of a histogram generated by the histogram generator 82. For example, the processing section 83 performs FIR (Finite Impulse Response) filtering, echo determination, depth value (distance value) calculation processing, peak detection processing, etc. The transmitter 79 outputs a depth image generated by the ranging processing section 80 through a DOUT terminal using, for example, a serial data. As an interface of the transmitter 79, for example, an MIPI (Mobile Industry Processor Interface) is usable.

The distance measurement device 70 is configured with use of, for example, two overlaid semiconductor substrates 88 and 89. The SPAD array 71 is disposed on the semiconductor substrate 88. Further, on the semiconductor substrate 89, the circuits other than the SPAD array 71 in the distance measurement device 70 are disposed. Specifically, on the semiconductor substrate 89, the SPAD controller 72, the controller 73, the PLL 74, the clock generator 75, the reference current source 76, the thermometer 77, the light-emission timing controller 78, the ranging processing section 80, and the transmitter 79 are disposed.

4. Example of Application to Mobile Object

The technology according to an embodiment of the present disclosure (the present technology) is applicable to various products. For example, the technology according to an embodiment of the present disclosure may be achieved in the form of an apparatus to be mounted to a mobile body of any kind. Examples of the mobile body include an automobile, an electric vehicle, a hybrid electric vehicle, a motorcycle, a bicycle, a personal mobility, an airplane, a drone, a vessel, and a robot.

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

FIG. 23 is a diagram depicting an example of the installation position of the imaging section 12031.

In FIG. 23, the vehicle 12100 includes imaging sections 12101, 12102, 12103, 12104, and 12105, as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front obtained by the imaging sections 12105 and 12101 is used mainly to detect a preceding vehicle, a pedestrian, an obstacle, a signal, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Heretofore, the description has been provided of an example of a vehicle control system to which a technology according to the present disclosure may be applied. The technology according to the present disclosure may be applicable to, among the configuration described above, the imaging section 12031. This makes it possible to facilitate a layout of the imaging section 12031 in the vehicle control system 12000, which makes it possible to simplify the layout of the imaging section 12031 and to suppress an influence of noise, for example. As a result, for example, it is possible to enhance the performance of the imaging section 12031. This allows the vehicle control system 12000 to enhance the accuracy of the collision avoidance or collision mitigation function of vehicles, the following travel function based on the inter-vehicle distance, the vehicle speed maintenance travel function, the collision warning function of the vehicle, the lane departure warning function of the vehicle, and the like.

The present technology is described thus far with reference to some embodiments and modification examples thereof; however, the present technology is not limited to these embodiments, etc., and various modifications may be made.

For example, in the respective embodiments described above, the plurality of light receiving elements 31 in the pixel array are disposed on the semiconductor substrate 110, and the elements and circuits other than the light receiving elements 31 in the pixel array are disposed on the semiconductor substrate 120; however, a configuration is not limited thereto. As an alternative, for example, the plurality of light receiving elements 31 and the plurality of resistor elements 32 in the pixel array may be disposed on the semiconductor substrate 110.

Further, for example, in the respective embodiments described above, the time measurement device outputs a measurement result in the time measurement section 24 as it is; however, operation is not limited thereto. Hereinafter, this is described in detail by citing an example of a time measurement unit 1H in which the present modification example is applied to the time measurement unit 1 according to the above-described first embodiment. The time measurement unit 1H includes a time measurement device 20H and a controller 14H.

FIG. 24 illustrates a configuration example of the time measurement device 20H. The time measurement device 20H has a histogram generator 25H. The histogram generator 25H has a plurality of histogram generation circuits 26 (in this example, N histogram generation circuits 26 (1) to 26 (N)). The histogram generation circuit 26 collects a plurality of count values CNT1 included in the signal S3 in each of the pixels 30 belonging to a single row on the basis of a control signal CTRL2, and generates a histogram of the count values CNT1 in each of the pixels 30. Subsequently, the histogram generation circuit 26 outputs, using a signal S4, the count value CNT1 having the highest frequency in the histogram in each of the pixels 30.

In generating the histogram of the count values CNT1, the histogram generation circuit 26 may correct the count values CNT1 obtained by time measuring operation (FIG. 6) by using, for example, a delay time obtained by calibration operation (FIG. 9) to generate the histogram with use of the corrected count values.

In this example, the present modification example is applied to the time measurement unit 1 according to the above-described first embodiment; however, this is not limitative. For example, the present modification example may be applied to the time measurement unit 1E (FIG. 12) according to the above-described first embodiment. In this case, in generating the histogram of the count values CNT1, the histogram generation circuit 26 may correct the count values CNT1 obtained by time measuring operation (FIG. 6) by using, for example, a delay time obtained by test operation (FIG. 14) to generate the histogram with use of the corrected count values.

Further, for example, the present modification example may be applied to the time measurement unit 2 according to the above-described second embodiment.

In addition, for example, in the respective embodiments described above, a pixel is configured with use of the single-photon avalanche diode (SPAD); however, for example, a backside illumination pixel is usable as such a pixel. FIG. 25 illustrates an example of the backside illumination pixel (a pixel 230). With reference to a lower side of the drawing, in the pixel 230, an SPAD 221 is disposed on an on-chip lens 223; a sensor substrate 241 is disposed on the SPAD 221; and further a circuit substrate 242 is disposed on the sensor substrate 241. Light enters the on-chip lens 223 (the lower side of the drawing) to come into the SPAD 221.

The SPAD 221 has an N-type semiconductor layer 201, a P-type semiconductor layer 202, a well 203, an anode 205, and a hole storage layer 207.

The N-type semiconductor layer 201 is a semiconductor layer that includes, for example, silicon (Si), having a high impurity concentration and a conductivity type of an N type. The P-type semiconductor layer 202 is a semiconductor layer having a high impurity concentration and a conductivity type of a P type. The N-type semiconductor layer 201 and the P-type semiconductor layer 202 configure a PN junction in an interfacial surface. The P-type semiconductor layer 202 is disposed under the N-type semiconductor layer 201. The N-type semiconductor layer 201 and the P-type semiconductor layer 202 are provided inside the well 203. The P-type semiconductor layer 202 has a multiplier region that performs avalanche multiplication of carriers generated by entrance of light. Preferably, the P-type semiconductor layer 202 is depleted, which ensures that the PDE (Photon Detection Efficiency) is improved.

The well 203 may be a semiconductor layer with the conductivity type of N type, or a semiconductor layer with the conductivity type of P type. Further, the impurity concentration in the well 203 is preferably, for example, a 1E14 order or less. This makes it possible to facilitate depletion of the well 203, which allows for improvement in the PDE.

The N-type semiconductor layer 201 functions as a cathode to be coupled to a circuit through a contact 204. The anode 205 is coupled to the circuit through a contact 206. The anode 205 is a same N-type semiconductor layer as the N-type semiconductor layer 201, being disposed between the N-type semiconductor layer 201 and a separating layer 208. Each of the contacts 204 and 206 includes a metallic material such as copper (Cu) and aluminum (Al), for example.

The hole storage layer 207 is a semiconductor layer with the conductivity type of P type. The hole storage layer 207 is disposed under the anode 205 between the separating layer 208 and the well 203 to be electrically coupled to the anode 205. The hole storage layer 207 is disposed at a portion in which different quality of materials comes in contact with each other. In other words, in an illustrated example, the separating layer 208 includes, for example, a silicon oxide film that is different from a constituent material of the well 203. Therefore, the hole storage layer 207 is provided to suppress a dark current that is generated on an interfacial surface between the separating layer 208 and the well 203. Further, the hole storage layer 207 is also disposed on the lower side of the well 203 (on the backside of the SPAD 221). In other words, the hole storage layer 207 is also disposed between the on-chip lens 223 and the well 203.

The separating layer 208 is disposed between the adjacent SPADs 221 to separate the respective SPADs 221. This leads to formation of a multiplier region corresponding to each of the SPADs 221 in a one-to-one manner. The separating layer 208 is disposed in a two-dimensional lattice pattern to surround a perimeter of the respective multiplier regions (the SPADs 221). As illustrated, the separating layer 208 is disposed to penetrate through from a top surface down to a bottom surface of the well 203 in a laminating direction. It is to be noted that, other than a configuration of penetrating through completely from the top surface down to the bottom surface, for example, a configuration in which the separating layer 208 is only partially inserted up to a midway through a substrate, or any other configuration may be permitted.

It is to be noted that the effects described herein are merely exemplified and non-limiting, and effects of the present disclosure may be other effects, or may further include other effects.

It is to be noted that the present technology may be configured as follows.

(1)
A time measurement device including:
a plurality of pixels provided side by side in a first direction, and each including a single-photon avalanche diode disposed on a first semiconductor substrate, and each generating a first logic signal depending on detection timing in the single-photon avalanche diode; and
a time measurement section that is disposed on a second semiconductor substrate attached to the first semiconductor substrate and measures the detection timing in each of the plurality of pixels,
pixels, other than a first pixel disposed on an end in the first direction and out of the plurality of pixels, each generating output signals on a basis of an output signal of a pixel other than relevant one of the pixels and on a basis of the first logic signals generated in the relevant one of the pixels, and
the time measurement section measuring the detection timing in each of the plurality of pixels on a basis of an output signal of a second pixel disposed on another end in the first direction out of the plurality of pixels.

(2)
The time measurement device according to (1), in which the pixels, other than the first pixel and out of the plurality of pixels, each include a first logic circuit, the first logic circuit being disposed on the second semiconductor substrate and having a first input terminal, a second input terminal, and an output terminal, the first input terminal receiving an output signal of the pixel other than the relevant one of the pixels, the second input terminal receiving the first logic signal.

(3)
The time measurement device according to (1) or (2), further including a control signal generator that is disposed on the second semiconductor substrate and generates a plurality of first control signals corresponding to the plurality of pixels, in which
each of the plurality of pixels includes:
a second logic circuit that is disposed on the second semiconductor substrate and generates a second logic signal on a basis of a corresponding first control signal out of the plurality of first control signals, and on a basis of a signal depending on a light receiving result in the single-photon avalanche diode of relevant one of the plurality of pixels, and
a third logic circuit that is disposed on the second semiconductor substrate and generates the first logic signal by performing toggle operation on a basis of the second logic signal.

(4)
The time measurement device according to (3), further including a waveform shaping section that generates a pulse signal on a basis of transition of an output signal of the second pixel, in which
the time measurement section measures the detection timing on a basis of the pulse signal.

(5)
The time measurement device according to (1) or (2), further including a control signal generator that is disposed on the second semiconductor substrate and generates a plurality of first control signals corresponding to the plurality of pixels, in which
each of the plurality of pixels includes a second logic circuit that is disposed on the second semiconductor substrate and generates the first logic signal on a basis of a corresponding first control signal out of the plurality of first control signals, and on a basis of a signal depending on a light receiving result in the single-photon avalanche diode of relevant one of the plurality of pixels.

(6)
The time measurement device according to any one of (1) to (5), in which the time measurement section further includes:
a counter; and
a latch that latches a count value in the counter on a basis of the output signal of the second pixel.

(7)
The time measurement device according to any one of (1) to (6), in which the first pixel generates the output signal of the first pixel on a basis of a third logic signal and on a basis of the first logic signal generated in the first pixel.

(8)
The time measurement device according to (7), in which the time measurement section measures a delay time from each pixel to the time measurement section on a basis of the output signal of the second pixel in an event of a change in the third logic signal.

(9)

The time measurement device according to (8), in which the time measurement section corrects a measurement result of the detection timing in each of the pixels on a basis of a measurement result of the delay time.

(10)

The time measurement device according to (1) or (2), further including a control signal generator that is disposed on the second semiconductor substrate and generates a plurality of first control signals corresponding to the plurality of pixels, in which each of the plurality of pixels includes:

a fourth logic circuit that is disposed on the second semiconductor substrate and generates a second logic signal on a basis of a corresponding first control signal out of the plurality of first control signals, on a basis of a second control signal, and on a basis of a signal depending on a light receiving result in the single-photon avalanche diode of relevant one of the plurality of pixels; and a third logic circuit that is disposed on the second semiconductor substrate and generates the first logic signal by performing toggle operation on a basis of the second logic signal.

(11)

The time measurement device according to (10), in which the time measurement section measures a delay time from a third pixel to the time measurement section on a basis of the output signal of the second pixel in changing the first logic signal of the third pixel out of the plurality of pixels using the second control signal.

(12)

The time measurement device according to (11), in which the time measurement section corrects a measurement result of the detection timing in the third pixel on a basis of a measurement result of the delay time.

(13)

The time measurement device according to any one of (1) to (12), in which the number of the plurality of pixels is 200 or more.

(14)

A time measurement device including:

a plurality of pixels provided side by side in a first direction, and each including a light receiving element, and each generating a first logic signal depending on detection timing in the light receiving element; and a time measurement section that measures the detection timing in each of the plurality of pixels, pixels, other than a first pixel disposed on an end in the first direction and out of the plurality of pixels, each generating output signals on a basis of an output signal of a pixel other than relevant one of the pixels and on a basis of the first logic signals generated in the relevant one of the pixels, and the time measurement section measuring the detection timing in each of the plurality of pixels on a basis of an output signal of a second pixel disposed on another end in the first direction out of the plurality of pixels.

(15)

The time measurement device according to (14), in which each of the plurality of pixels includes a first logic circuit, the first logic circuit having a first input terminal, a second input terminal, and an output terminal, the first input terminal receiving an output signal of the pixel other than the relevant one of the pixels, the second input terminal receiving the first logic signal.

(16)

The time measurement device according to (14) or (15), further including a control signal generator that generates a plurality of first control signals corresponding to the plurality of pixels, in which each of the plurality of pixels includes:

a second logic circuit that generates a second logic signal on a basis of a corresponding first control signal out of the plurality of first control signals, and on a basis of a signal depending on a light receiving result in the light receiving element of relevant one of the plurality of pixels, and a third logic circuit that generates the first logic signal by performing toggle operation on a basis of the second logic signal.

(17)

The time measurement device according to (14) or (15), further including a control signal generator that generates a plurality of first control signals corresponding to the plurality of pixels, in which each of the plurality of pixels includes a second logic circuit that generates the first logic signal on a basis of a corresponding first control signal out of the plurality of first control signals, and on a basis of a signal depending on a light receiving result in the light receiving element of relevant one of the plurality of pixels.

(18)

The time measurement device according to any one of (14) to (17), in which the light receiving element is a single-photon avalanche diode or an avalanche photodiode.

(19)

A time measurement device including:

a first pixel, a second pixel, and a third pixel, each of the first pixel, the second pixel, and the third pixel including a single-photon avalanche diode disposed on a first semiconductor substrate, and generating a first logic signal depending on detection timing in the single-photon avalanche diode; and a time measurement section that is disposed on a second semiconductor substrate attached to the first semiconductor substrate and measures the detection timing in each of the first pixel, the second pixel, and the third pixel, the second pixel generating an output signal on a basis of an output signal of the first pixel and on a basis of the first logic signal generated in the second pixel, the third pixel generating an output signal on a basis of an output signal of the second pixel and on a basis of the first logic signal generated in the third pixel, and the time measurement section measuring the detection timing in each of the first pixel, the second pixel, and the third pixel on a basis of an output signal of the third pixel.

(20)

A time measurement unit including:

a light-emitting section that emits light;

a mirror that reflects reflective light corresponding to the light;

a plurality of pixels provided side by side in a first direction, and each including a single-photon avalanche diode that is disposed on a first semiconductor substrate and detects the reflective light reflected by the mirror, and each generating a first logic signal depending on detection timing in the single-photon avalanche diode; and a time measurement section that is disposed on a second semiconductor substrate attached to the first semiconductor substrate and measures the detection timing in each of the plurality of pixels, pixels, other than a first pixel disposed on an end in the first direction and out of the plurality of pixels, each generating output signals on a basis of an output signal of a pixel other than relevant one of the pixels and on a basis of the first logic signals generated in the relevant one of the pixels, and the time measurement section measuring the detection timing in each of the plurality of pixels on a basis of an output signal of a second pixel disposed on another end in the first direction out of the plurality of pixels.

(21)

A time measurement unit including:

a light-emitting section that emits light;

a mirror that reflects reflective light corresponding to the light;

a plurality of pixels provided side by side in a first direction, and each including a light receiving element that detects the reflective light reflected by the mirror, and each generating a first logic signal depending on detection timing in the light receiving element; and a time measurement section that measures the detection timing in each of the plurality of pixels, pixels, other than a first pixel disposed on an end in the first direction and out of the plurality of pixels, each generating output signals on a basis of an output signal of a pixel other than relevant one of the pixels and on a basis of the first logic signals generated in the relevant one of the pixels, and the time measurement section measuring the detection timing in each of the plurality of pixels on a basis of an output signal of a second pixel disposed on another end in the first direction out of the plurality of pixels.

(22)

A time measurement unit including:

a light-emitting section that emits light;

a mirror that reflects reflective light corresponding to the light;

a first image, a second pixel, and a third pixel, each of the first pixel, the second pixel, and the third pixel including a single-photon avalanche diode that is disposed on a first semiconductor substrate and detects the reflective light reflected by the mirror, and generating a first logic signal depending on detection timing in the single-photon avalanche diode; and a time measurement section that is disposed on a second semiconductor substrate attached to the first semiconductor substrate and measures the detection timing in each of the first pixel, the second pixel, and the third pixel, the second pixel generating an output signal on a basis of an output signal of the first pixel and on a basis of the first logic signal generated in the second pixel, the third pixel generating an output signal on a basis of an output signal of the second pixel and on a basis of the first logic signal generated in the third pixel, and the time measurement section measuring the detection timing in each of the first pixel, the second pixel, and the third pixel on a basis of an output signal of the third pixel.

This application claims the priority on the basis of Japanese Patent Application No. 2017-190304 filed on Sep. 29, 2017 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A time measurement device comprising:

a plurality of pixels provided side by side in a first direction, and each pixel of the plurality of pixels including a single-photon avalanche diode disposed on a first semiconductor substrate, and the each pixel configured to generate a first logic signal depending on a detection timing in the single-photon avalanche diode; and a time measurement circuitry that is disposed on a second semiconductor substrate attached to the first semiconductor substrate, the time measurement circuitry is configured to measure the detection timing in the each pixel of the plurality of pixels, wherein a first subset of the plurality of pixels that does not include a first pixel disposed on a first end in the first direction, each subset pixel of the first subset is configured to generate an output signal based on an input signal generated by a preceding pixel of the plurality of pixels and the first logic signal that is generated by the each subset pixel, and wherein, to measure the detection timing in the each pixel of the plurality of pixels, the time measurement circuitry is configured to measure the detection timing based on the output signal of a second pixel of the plurality of pixels, the second pixel disposed on a second end in the first direction that is opposite from the first end.

2. The time measurement device according to claim 1, wherein the each subset pixel of the first subset includes a first logic circuit, the first logic circuit being disposed on the second semiconductor substrate and having a first input terminal configured to receive the input signal generated by the preceding pixel, a second input terminal configured to receive the first logic signal, and an output terminal configured to output the output signal.

3. The time measurement device according to claim 1, further comprising a control signal generator that is disposed on the second semiconductor substrate, the control signal generator is configured to generate a plurality of first control signals corresponding to the plurality of pixels, wherein the each pixel of the plurality of pixels includes:

a second logic circuit that is disposed on the second semiconductor substrate, the second logic circuit is configured to generate a second logic signal based on a corresponding first control signal of the plurality of first control signals and a signal depending on a light receiving result in the single-photon avalanche diode of the each pixel, and a third logic circuit that is disposed on the second semiconductor substrate, the third logic circuit is configured to generate the first logic signal by performing a toggle operation based on the second logic signal.

4. The time measurement device according to claim 3, further comprising a waveform shaping circuitry that generates a pulse signal based on a transition of the output signal of the second pixel, wherein the time measurement circuitry is configured to measure the detection timing based on the pulse signal.

5. The time measurement device according to claim 1, further comprising a control signal generator that is disposed on the second semiconductor substrate, the control signal generator is configured to generate a plurality of first control signals corresponding to the plurality of pixels, wherein the each pixel of the plurality of pixels includes a second logic circuit that is disposed on the second semiconductor substrate, the second logic circuit is configured to generate the first logic signal based on a corresponding first control signal of the plurality of first control signals and a signal depending on a light receiving result in the single-photon avalanche diode of the each pixel.

6. The time measurement device according to claim 1, wherein the time measurement circuitry further includes:
   a counter; and
   a latch that latches a count value in the counter based on the output signal of the second pixel.

7. The time measurement device according to claim 1, wherein the first pixel is further configured to generate the output signal of the first pixel based on a second logic signal and the first logic signal generated by the first pixel.

8. The time measurement device according to claim 7, wherein the time measurement circuitry is further configured to measure a delay time from the each pixel to the time measurement circuitry based on the output signal of the second pixel in an event of a change in the second logic signal.

9. The time measurement device according to claim 8, wherein the time measurement circuitry is further configured to correct a measurement result of the detection timing in the each pixel of the plurality of pixels based on a measurement result of the delay time.

10. The time measurement device according to claim 1, further comprising a control signal generator that is disposed on the second semiconductor substrate, the control signal generator is configured to generate a plurality of first control signals corresponding to the plurality of pixels, wherein
   the each pixel of the plurality of pixels includes:
      a second logic circuit that is disposed on the second semiconductor substrate, the second logic circuit is configured to generate a second logic signal based on a corresponding first control signal out of the plurality of first control signals, a second control signal, and a signal depending on a light receiving result in the single-photon avalanche diode of the each pixel; and
      a third logic circuit that is disposed on the second semiconductor substrate, the third logic circuit is configured to generate the first logic signal by performing a toggle operation based on the second logic signal.

11. The time measurement device according to claim 10, wherein the time measurement circuitry is further configured to measure a delay time from a third pixel of the plurality of pixels to the time measurement circuitry based on the output signal of the second pixel in changing the first logic signal of the third pixel using the second control signal.

12. The time measurement device according to claim 11, wherein the time measurement circuitry is further configured to correct a measurement result of the detection timing in the third pixel on a basis of a measurement result of the delay time.

13. The time measurement device according to claim 1, wherein the plurality of pixels includes two-hundred or more pixels.

14. A time measurement device comprising:
   a plurality of pixels provided side by side in a first direction, and each pixel of the plurality of pixels includes a light receiving element, and the each pixel is configured to generate a first logic signal depending on a detection timing in the light receiving element; and
   a time measurement circuitry configured to measure the detection timing in the each pixel of the plurality of pixels,
   wherein a first subset of the plurality of pixels that does not include a first pixel disposed on a first end in the first direction, each subset pixel of the first subset is configured to generate an output signal based on an input signal generated by a preceding pixel of the plurality of pixels and the first logic signal that is generated by the each subset pixel, and
   wherein, to measure the detection timing in the each pixel of the plurality of pixels, the time measurement circuitry is configured to measure the detection timing based on the output signal of a second pixel of the plurality of pixels disposed on a second end in the first direction that is opposite from the first end.

15. The time measurement device according to claim 14, wherein the each pixel of the plurality of pixels includes a first logic circuit, the first logic circuit having a first input terminal configured to receive the input signal generated by the preceding pixel, a second input terminal configured to receive the first logic signal, and an output terminal configured to output the output signal.

16. The time measurement device according to claim 14, further comprising a control signal generator configured to generate a plurality of first control signals corresponding to the plurality of pixels, wherein
   the each pixel of the plurality of pixels includes:
      a second logic circuit that generates a second logic signal based on a corresponding first control signal of the plurality of first control signals and a signal depending on a light receiving result in the light receiving element of the each pixel, and
      a third logic circuit configured to generate the first logic signal by performing a toggle operation based on the second logic signal.

17. The time measurement device according to claim 14, further comprising a control signal generator configured to generate a plurality of first control signals corresponding to the plurality of pixels, wherein
   the each pixel of the plurality of pixels includes a second logic circuit configured to generate the first logic signal based on a corresponding first control signal of the plurality of first control signals and a signal depending on a light receiving result in the light receiving element of the each pixel.

18. The time measurement device according to claim 14, wherein the light receiving element is a single-photon avalanche diode or an avalanche photodiode.

19. A time measurement device comprising:
   a first pixel including a first single-photon avalanche diode disposed on a first semiconductor substrate, and the first pixel is configured to generate a first logic signal depending on a first detection timing in the first single-photon avalanche diode;
   a second pixel including a second single-photon avalanche diode disposed on the first semiconductor substrate, and the second pixel is configured to generate a second logic signal depending on a second detection timing in the second single-photon avalanche diode;
   a third pixel including a third single-photon avalanche diode disposed on the first semiconductor substrate, and the third pixel is configured to generate a third logic signal depending on a third detection timing in the third single-photon avalanche diode; and
   a time measurement circuitry that is disposed on a second semiconductor substrate attached to the first semiconductor substrate, the time measurement circuitry is configured to measure the first detection timing, the second detection timing, and the third detection timing,
   wherein the second pixel is configured to generate a second output signal based on a first output signal of the first pixel and the second logic signal, wherein the third pixel is configured to generate a third output signal based on the second output signal and the third logic signal, and wherein, to measure the first detection timing, the second detection timing, and the third detection timing, the time measurement circuitry is configured to measure the first detection timing, the second detection timing, and the third detection timing based on the third output signal.

20. A time measurement unit comprising:

a light-emitting circuitry configured to emit light;

a mirror configured to reflect reflective light corresponding to the light that is emitted;

a plurality of pixels provided side by side in a first direction, and each pixel of the plurality of pixels including a single-photon avalanche diode that is disposed on a first semiconductor substrate, and the each pixel is configured to
 detect the reflective light that is reflected by the mirror, and
 generate a first logic signal depending on a detection timing in the single-photon avalanche diode; and a time measurement circuitry that is disposed on a second semiconductor substrate attached to the first semiconductor substrate, the time measurement circuitry is configured to measure the detection timing in the each pixel of the plurality of pixels, wherein a first subset of the plurality of pixels that does not include a first pixel disposed on a first end in the first direction, each subset pixel of the first subset is configured to generate an output signal based on an input signal generated by a preceding pixel of the plurality of pixels and the first logic signal that is generated by the each subset pixel, and wherein, to measure the detection timing in the each pixel of the plurality of pixels, the time measurement circuitry is configured to measure the detection timing based on the output signal of a second pixel of the plurality of pixels disposed on a second end in the first direction that is opposite from the first end.

21. A time measurement unit comprising:

a light-emitting circuitry configured to emit light;

a mirror configured to reflect reflective light corresponding to the light that is emitted;

a plurality of pixels provided side by side in a first direction, and each pixel of the plurality of pixels including a light receiving element configured to detect the reflective light that is reflected by the mirror, and the each pixel is configured to generate a first logic signal depending on a detection timing in the light receiving element; and a time measurement circuitry configured to measure the detection timing in the each pixel of the plurality of pixels, wherein a first subset of the plurality of pixels that does not include a first pixel disposed on a first end in the first direction, each subset pixel of the first subset is configured to generate an output signal based on an input signal generated by a preceding pixel of the plurality of pixels and the first logic signal that is generated by the each subset pixel, and wherein, to measure the detection timing in the each pixel of the plurality of pixels, the time measurement circuitry is configured to measure the detection timing based on the output signal of a second pixel of the plurality of pixels disposed on a second end in the first direction that is opposite from the first end.

22. A time measurement unit comprising:

a light-emitting circuitry configured to emit light;

a mirror configured to reflect reflective light corresponding to the light that is emitted;

a first pixel including a first single-photon avalanche diode that is disposed on a first semiconductor substrate, the first single-photon avalanche diode is configured to detect the reflective light that is reflected by the mirror, and the first pixel is configured to generate a first logic signal depending on a first detection timing in the first single-photon avalanche diode;

a second pixel including a second single-photon avalanche diode that is disposed on the first semiconductor substrate, the second single-photon avalanche diode is configured to detect the reflective light that is reflected by the mirror, and the second pixel is configured to generate a second logic signal depending on a second detection timing in the second single-photon avalanche diode;

a third pixel including a third single-photon avalanche diode that is disposed on the first semiconductor substrate, the third single-photon avalanche diode is configured to detect the reflective light that is reflected by the mirror, and the third pixel is configured to generate a third logic signal depending on a third detection timing in the third single-photon avalanche diode; and a time measurement circuitry that is disposed on a second semiconductor substrate attached to the first semiconductor substrate, the time measurement circuitry is configured to measure the first detection timing, the second detection timing, and the third detection timing, wherein the second pixel is configured to generate a second output signal based on a first output signal of the first pixel and the second logic signal, wherein the third pixel is configured to generate a third output signal based on the second output signal and the third logic signal, and wherein, to measure the first detection timing, the second detection timing, and the third detection timing the time measurement circuitry is configured to measure the first detection timing, the second detection timing, and the third detection timing based on the third output signal.

* * * * *